United States Patent
Wu et al.

(10) Patent No.: US 12,094,799 B2
(45) Date of Patent: Sep. 17, 2024

(54) METHOD OF MAKING A SEMICONDUCTOR DEVICE HAVING A THERMAL CONTACT

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: Jian Wu, Hsinchu (TW); Feng Han, Hsinchu (TW); Shuai Zhang, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 0 days.

(21) Appl. No.: 17/818,782

(22) Filed: Aug. 10, 2022

(65) Prior Publication Data
US 2022/0384296 A1    Dec. 1, 2022

Related U.S. Application Data

(63) Continuation of application No. 17/122,749, filed on Dec. 15, 2020, now Pat. No. 11,862,527.

(30) Foreign Application Priority Data

Nov. 20, 2020 (CN) .......................... 202011306929.9

(51) Int. Cl.
*H01L 23/00* (2006.01)
*H01L 21/48* (2006.01)
(Continued)

(52) U.S. Cl.
CPC .......... *H01L 23/36* (2013.01); *H01L 21/4871* (2013.01); *H01L 21/4875* (2013.01); *H01L 27/1203* (2013.01)

(58) Field of Classification Search
CPC ..... H01L 23/36; H01L 23/367; H01L 23/373; H01L 27/1203
See application file for complete search history.

(56) References Cited

U.S. PATENT DOCUMENTS 6,352,882 B1    3/2002    Assaderaghi et al.
6,573,565 B2    6/2003    Clevenger et al.
(Continued)

OTHER PUBLICATIONS

Office Action dated Oct. 4, 2021 for corresponding case No. TW 11020962840. (pp. 1-4).

*Primary Examiner* — Reema Patel
(74) *Attorney, Agent, or Firm* — Hauptman Ham, LLP

(57) ABSTRACT

A method of making an integrated circuit includes operations related to forming an oxide layer over a top surface of a substrate; depositing a layer of semiconductor material over the oxide layer; and manufacturing a thermal substrate contact extending through the layer of semiconductor material and the oxide layer to the top surface of the substrate. The thermal substrate contact is against, but does not extend through, the substrate. Manufacturing a thermal substrate contact further includes operations of etching a first opening through the layer of semiconductor material to expose the oxide layer; etching a second opening through the first opening to expose the substrate; and filling the first opening and the second opening with a conductive material.

20 Claims, 11 Drawing Sheets

(51) Int. Cl.
*H01L 23/36* (2006.01)
*H01L 27/12* (2006.01)

(56) References Cited

U.S. PATENT DOCUMENTS

| | | | |
|---|---|---|---|
| 10,460,982 B1* | 10/2019 | Li | H01L 27/1203 |
| 2003/0189231 A1* | 10/2003 | Clevenger | H01L 27/1203 |
| | | | 257/E23.105 |
| 2008/0017931 A1 | 1/2008 | Shih et al. | |
| 2010/0019385 A1 | 1/2010 | Bartley et al. | |
| 2015/0115431 A1 | 4/2015 | Chadwick et al. | |
| 2016/0167953 A1 | 6/2016 | Gogoi | |
| 2017/0200620 A1 | 7/2017 | Collins et al. | |
| 2017/0330789 A1 | 11/2017 | Kar-Roy et al. | |
| 2018/0174948 A1 | 6/2018 | Butt et al. | |
| 2019/0393130 A1 | 12/2019 | Mahnkopf et al. | |

* cited by examiner

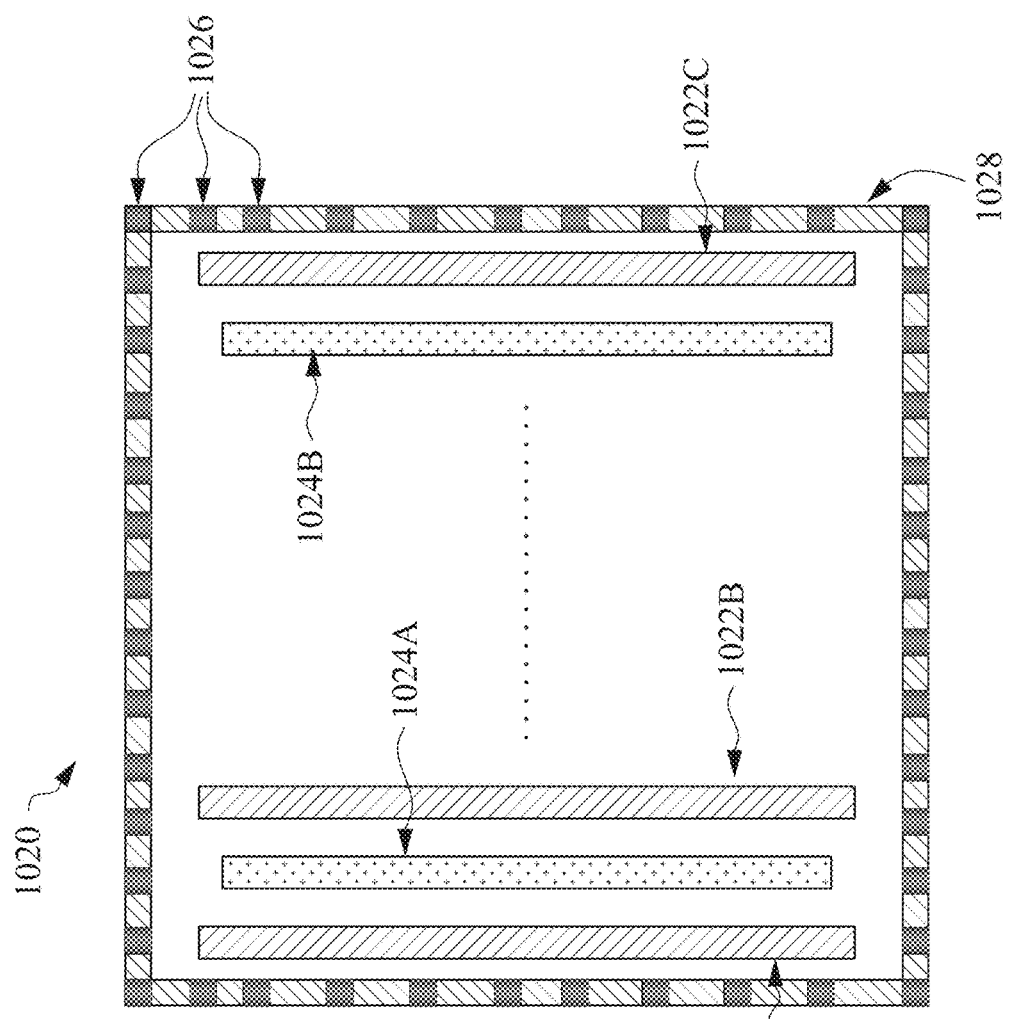
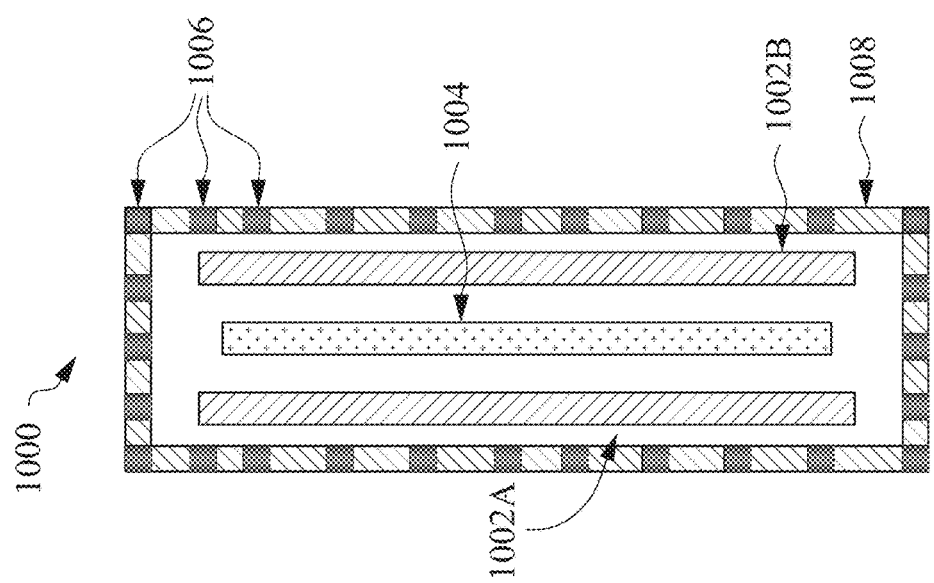
FIG. 10B
FIG. 10A

METHOD OF MAKING A SEMICONDUCTOR DEVICE HAVING A THERMAL CONTACT

RELATED APPLICATIONS

This application is a divisional of U.S. application Ser. No. 17/122,749, filed Dec. 15, 2020, which claims the priority of China Application No. 202011306929.9, filed Nov. 20, 2020, the contents of which are hereby incorporated by reference in their entireties.

BACKGROUND

Integrated circuits generate heat during operation from the flow of electrical current through transistors and wires of the integrated circuit. Passive and active cooling of integrated circuits increase the lifespan of circuits and increase the range of operating voltage of an integrated circuit. Improvements in active and passive cooling of integrated circuits are associated with increased top operating speed of an integrated circuit, and with a higher top operating voltage of the integrated circuit.

Integrated circuits having oxide layer between the transistors and the substrate (e.g., SOI, or silicon on insulator) employ the oxide layer on the substrate to reduce leakage current in the integrated circuit. The oxide layer acts as a thermal insulator, reducing the heat diffusion away from the generation locations, e.g., the transistors, of the integrated circuit. The thermal insulation reduces the ability to dissipate heat through the substrate.

BRIEF DESCRIPTION OF THE DRAWINGS

FIGS. 10A and 10B are block diagrams of an integrated circuit, in accordance with some embodiments.

DETAILED DESCRIPTION

Figure 1:
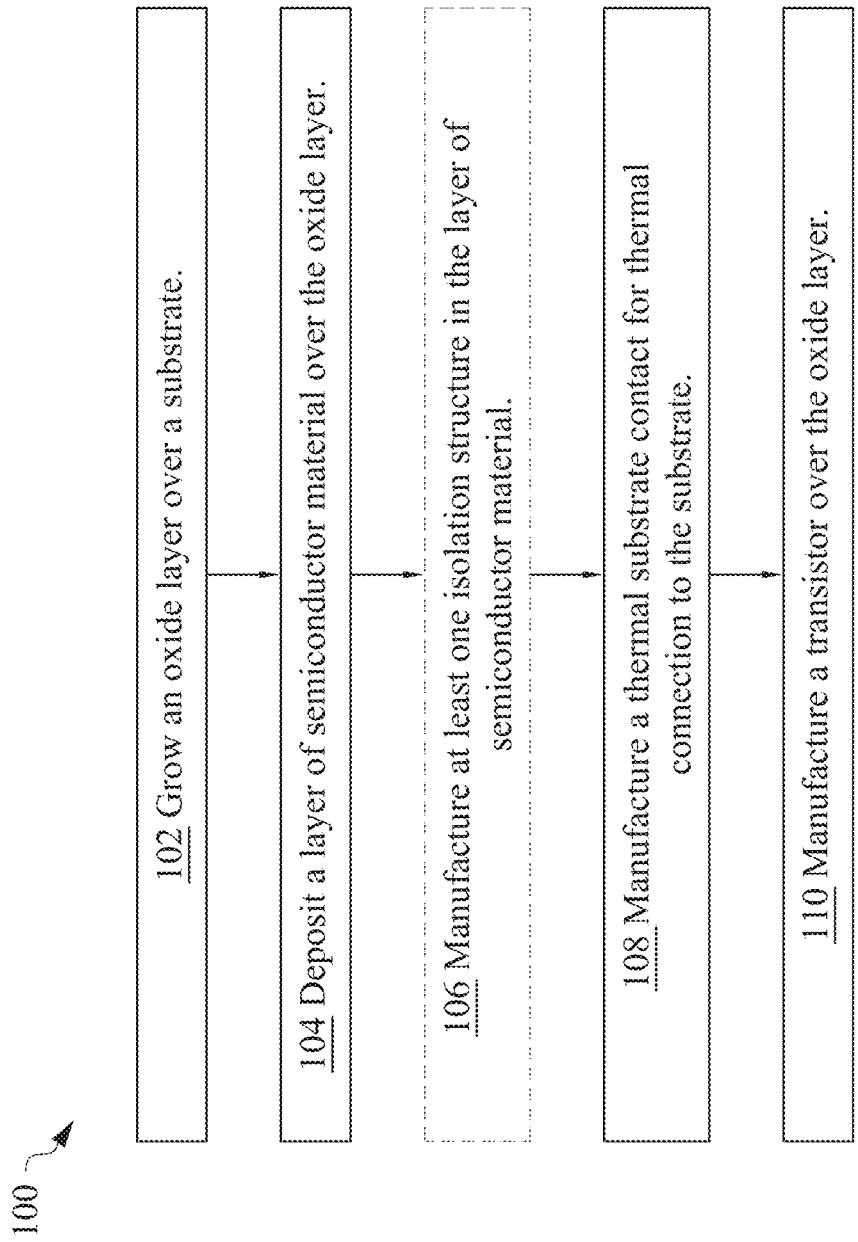
FIG. 1 is a flow diagram of a method of making a thermal substrate contact, in accordance with some embodiments.

The following disclosure provides many different embodiments, or examples, for implementing different features of the provided subject matter. Specific examples of components, values, operations, materials, arrangements, etc., are described below to simplify the present disclosure. These are, of course, merely examples and are not intended to be limiting. Other components, values, operations, materials, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Thermal management of integrated circuits is relevant to the lifespan of an integrated circuit during operation, and to the performance of an integrated circuit. In some instances, the operating voltage of an integrated circuit is modified to overclock the processor of the computer to increase the processor speed. The overclocking increases an amount of heat generated in the integrated circuit. Heat produced by an integrated circuit comes from the flow of electrical current through interconnection structures and transistors in the integrated circuit. Increased speed and increased operating voltages are associated with larger amounts of heat production by an integrated circuit. Integrated circuits have heat tolerance specifications to preserve and protect the operation of the integrated circuit. Integrated circuits which exceed the heat tolerance specifications tend to have reduced operating lifetimes and/or logic errors during operation. A reduced operating lifetime of an integrated circuit, or logic errors, are related to the quality of the channel region of the transistor. As dopants in the source and/or drain regions of an integrated circuit migrate outward from dopant regions in the source or drain regions of the integrated circuit (source or drain wells of the integrated circuit), leakage current of the transistors impacted by migrating dopants increases and the performance suffers.

Heat generated from the integrated circuit flows away from the generation locations toward the surface of the integrated circuit. At the surface of the integrated circuit, heatsinks or ambient cooling material (air, or liquid for immersed computing devices) transfer heat away from the integrated circuit. Heat generated from transistors flows from the transistors through interconnection structures in the integrated circuit toward a top surface of the integrated circuit, where heatsinks and/or ambient cooling material transfer the heat away. The dielectric materials which surround the conductive vias and/or metal lines in the integrated circuit interconnection structure act as insulators, or poor heat conductors, with respect to the conductive vias and/or metal lines in the interconnection structure.

In a silicon on insulator (SOI) device, an oxide layer, or layer of insulating material, is between transistors and the substrate. The oxide layer is a poor thermal conductor, and conducts little heat away from the integrated circuit. As a result, heat dissipation from the transistors through the substrate is limited in some approaches. This tends to negatively impact integrated circuits especially as device size continues to shrink and heat generating elements are located closer together within the integrated circuit.

A thermal substrate contact which passes through the oxide layer and is in direct contact with the substrate helps to transfer heat from the transistors into the substrate. The thermal substrate contact lands on the substrate at the substrate top surface, or extends into a recess into the substrate. The thermal substrate contact is also in direct contact with the layer of semiconductor material above the oxide layer. Thus, downward (e.g., toward the substrate) thermal conduction combined with upward (e.g., away from the substrate, through the integrated circuit) thermal conduction increases the cooling rate of the integrated circuit. By increasing the cooling rate of an integrated circuit, the peak temperatures reached by the transistors and other components of the integrated circuit are reduced, extending the lifetime of the integrated circuit. Further, by increasing the cooling rate of the integrated circuit, the negative consequences (shortened lifetime, and so forth) of overclocking an integrated circuit are reduced. By increasing the cooling rate of the integrated circuit, the heat removed from the integrated circuit increases the time which an integrated circuit such as a central processing unit, or a graphic processing unit, operates before turning on active cooling systems to protect the integrated circuits from high temperature conditions.

FIG. 1 is a flow diagram of a method 100 of making a thermal substrate contact, in accordance with some embodiments.

Method 100 includes an operation 102 in which an oxide layer is formed over a substrate. A substrate suitable for integrated circuits includes a semiconductor material such as silicon (Si) or silicon germanium (SiGe), among other materials. Substrate materials used in integrated circuit manufacturing have relatively high thermal conductivity, with respect to an oxide layer grown over the substrate. In some embodiments, forming an oxide layer includes chemical vapor deposition of an insulator material. In some embodiments, forming an oxide layer includes physical vapor deposition of an insulator material. Methods of depositing, as opposed to growing, an oxide layer over a substrate are suitable for use on substrates which are not semiconductor materials (e.g., sapphire (aluminum oxide, $Al_2O_3$), diamond, and so forth). In some embodiments, an oxide layer includes a layer of silicon dioxide over a semiconductor material. In some embodiments, forming an oxide layer includes growing an oxide layer by processing the substrate top surface with oxygen, water vapor, or steam. Processing the substrate top surface with oxygen, water vapor, or steam promotes formation of native oxide on an exposed surface of a semiconductor material. According to some embodiments, the growth of a native oxide by reacting the semiconductor material with oxygen, water vapor, or steam, provides a uniform and dense insulating material to electrically isolate the unreacted semiconductor material from a layer of semiconductor material deposited over the oxide layer.

In some embodiments, an oxide layer is grown over a top surface of a substrate in order to electrically isolate (e.g., insulate) the substrate from the integrated circuit over the oxide layer. By electrically isolating the substrate from the integrated circuit, the oxide layer reduces leakage current in the integrated circuit. Leakage current in an integrated circuit flows through from a source of one transistor of an integrated circuit through the substrate to a drain of another transistor of the integrated circuit. The oxide layer reduces the volume of semiconducting material available for leakage current to flow. In some embodiments, an oxide layer grown over a substrate abuts the bottom of a well of the transistor, such that leakage current does not flow below the well. A buried oxide layer also provides, by electrically isolating substrate from a remainder of the integrated circuit, noise reduction by reducing and/or eliminating the influence of transient or permanent voltages applied to the substrate material on the integrated circuit (especially the channel regions of the integrated circuit). According to some embodiments, an interconnection structure of an integrated circuit is electrically connected to a thermal substrate contact which extends through the layer of semiconductor material and the oxide layer to electrically connect with the substrate. Tying the substrate to a voltage source from the integrated circuit decreases electrical noise in the integrated circuit. Tying the substrate to a voltage source of the integrated circuit adjusts and/or tightens a distribution of transistor switching speeds of the integrated circuit because bias from the substrate is consistent across the integrated circuit.

Method 100 includes an operation 104 in which a layer of semiconductor material is deposited over the oxide layer. In some embodiments, the layer of semiconductor material is formed by epitaxial deposition. In epitaxial deposition, a layer of material is grown from a liquid or gaseous medium on a surface of a substrate during integrated circuit manufacturing. In some embodiments, the material has a same chemical composition and a same lattice constant as the material on which the material is grown. In some embodiments, such as embodiments wherein the material includes dopants different from the material on which the crystalline material is grown, the lattice constant of the grown material differs from the lattice constant of the growth surface material, resulting in strain being exerted at the interface between the grown material and the growth surface material. Materials suitable for epitaxial deposition include silicon, doped semiconductor material (e.g., with P-type or N-type dopants), undoped heterogeneous semiconductor materials, type III-V heterogeneous semiconductor materials, and so forth. In some embodiments, the layer of semiconductor material is deposited by chemical vapor deposition. In some embodiments, chemical vapor deposition produces a layer of material on a growth surface wherein the layer of material is less ordered than a purely crystalline material, but is not amorphous. Materials suitable for chemical vapor deposition include silicon, doped semiconductor material (e.g., with P-type or N-type dopants), undoped heterogeneous semiconductor materials, type III-V heterogeneous semiconductor materials, and so forth. In some embodiments, the layer of semiconductor material is deposited or grown over the oxide layer, and planarized using chemical mechanical polishing (CMP) to produce a flat surface for source, drain, and channel regions of transistors of the integrated circuit. In some embodiments, the layer of semiconductor material is deposited or grown over the oxide layer and thinned using a liquid or chemical etch process to adjust the thickness of the layer of semiconductor material prior to forming source, drain, and channel regions of transistors of the integrated circuit.

Method 100 includes an operation 106 in which at least one isolation structure is manufactured in the layer of semiconductor material. Isolation structures prevent or reduce electrical interactions between elements of the integrated circuit in the layer of semiconductor material. In some embodiments, isolation structures include shallow trench isolation structures (STI structures, or STI) which extend part way into the layer of semiconductor material. In some embodiments, isolation structures include deep trench isolation structures (DTI structures, or DTI) which extend deeper into the layer of semiconductor material than shallow trench isolation structures. In some embodiments, deep trench isolation structures extend from a top surface of the layer of semiconductor material to a top surface of the oxide layer. In some embodiments, a shallow trench isolation structure has a portion of a deep trench isolation structure extending from a bottom of the shallow trench isolation structure to a top surface of the oxide layer.

An isolation structure is formed in the layer of semiconductor material by operations of: depositing a layer of patterning material over the layer of semiconductor material; transferring a pattern to the layer of patterning material, the pattern having openings corresponding to the locations of the isolation structure in the layer of semiconductor material; etching openings in the layer of semiconductor material through the openings in the pattern; and filling the openings in the layer of semiconductor material with a dielectric material. For a shallow trench isolation structure, the openings in the layer of semiconductor material extend part-way through the layer of semiconductor material, and the dielectric material extends (after filling) part-way through the layer of semiconductor material. For a deep trench isolation structure, the openings in the layer of semiconductor material extend deeper into the layer of semiconductor material than for a shallow trench isolation structure. In some embodiments, the openings in the layer of semiconductor material, and the insulator material filled into the openings, extends from a top surface of the layer of semiconductor material to a top surface of the layer below the layer of semiconductor material (e.g., the oxide layer). In some embodiments, a shallow trench isolation structure is manufactured at a location in an integrated circuit, and a deep trench isolation structure is manufactured at the same location in the integrated circuit, and extends through the shallow trench isolation structure.

The flow of method 100 next includes an operation 108 in which a thermal substrate contact is manufactured to provide a thermal connection to the substrate. In some embodiments of operation 108, the thermal substrate contact is manufactured to land on a top surface of the substrate after clearing away a portion of the oxide layer to form an opening through the oxide layer. In some embodiments, the substrate has a recess formed therein and the thermal substrate contact fills the recess in the substrate. According to some embodiments, a recess is formed in a top surface of the substrate by an etch process which forms the opening in which conductive material of the thermal substrate contact is formed. According to some embodiments, the etch process to form an opening for a thermal substrate contact stops against a top surface of the substrate without forming a recess in the substrate material.

In some embodiments, the etch process is a wet etch process. In an embodiment, a wet etch process uses hydrofluoric acid (HF) in water to etch openings in the layer of semiconductor material or the oxide layer. At 49% HF in water, aqueous hydrofluoric acid etches silicon dioxide or other oxide materials with good selectivity to semiconductor materials, especially silicon dioxide. Thus, aqueous hydrofluoric acid clears oxide layer material from the surface of the substrate without forming a recess in the substrate because the hydrofluoric acid etches the oxide layer material (e.g., silicon dioxide) faster than the substrate material (e.g., silicon).

In some embodiments, the etch process is a dry etch process, or a plasma etch process. A plasma etch process forms openings for thermal substrate contacts by ionizing reactant molecules in a plasma above the surface of a substrate having the oxide layer and the layer of semiconductor material thereon, and applying a voltage to the plasma to accelerate the ions against the exposed surface of the oxide layer of layer of semiconductor material, through openings in a patterned layer of patterning material. Etchants for plasma etching of openings for thermal substrate contacts include one or more of trifluoromethane ($CHF_3$), hexafluoroethane ($C_2F_6$), octafluoropropane ($C_3F_8$), and so forth with oxygen and argon (for dilution). Increasing the ratio of fluorocarbon to oxygen increases the selectivity of the plasma etch to silicon (over silicon dioxide) at the expense of additional polymer formation during etching. In some embodiments, an oxygen plasma, or an oxygen/tetrafluoromethane ($CF_4$) plasma is used to remove residual polymer from thermal substrate contact openings before depositing thermally conductive material (e.g., a metallic compound or a semiconductor material) into the openings and against the substrate. Thermal substrate contacts have a higher thermal conductivity than the oxide layer between the layer of semiconductor material and the substrate. By providing a higher-thermal conductivity pathway for diffusion of heat downward in the integrated circuit, the thermal substrate contact increases cooling efficiency of the integrated circuit and increases the thermal and operating voltage window of the integrated circuit.

According to some embodiments, the thermal substrate contact is a semiconductor material. In some embodiments, the thermal substrate contact is an electrically conductive material. In some embodiments, the electrically conductive material is a metallic material such as tungsten (W), cobalt (Co), titanium (Ti), tantalum (Ta), nickel (Ni), and so forth, or alloys thereof.

In some embodiments, a semiconductor material used for a thermal substrate contact is deposited by, e.g., epitaxial deposition or chemical vapor deposition of the semiconductor material, as described above for deposition of the layer of semiconductor material. In some embodiments, an electrically conductive material is deposited by sputtering atoms of the electrically conductive material from a sputtering target onto the top surface of the integrated circuit.

In some embodiments, the thermal substrate contact is manufactured by forming a single opening through the layer of semiconductor material and through the oxide layer to expose the substrate, and then filling the single opening with thermal substrate contact material in one fill step. In some embodiments, a thermal substrate contact is manufactured by forming a first opening through the oxide layer and filling the opening through the oxide layer to form a first thermal substrate contact segment, followed by depositing the layer of semiconductor material, and forming therethrough a second opening aligned with the first thermal substrate contact segment, and forming a second thermal substrate contact segment by filling the second opening with a thermal substrate contact material. In some embodiments, the thermal substrate contact material of the first thermal substrate contact segment and the second thermal substrate contact segment are a same thermal substrate contact material. In some embodiments, the thermal substrate contact material of the first thermal substrate contact segment and the second thermal substrate contact segment are different thermal substrate contact materials.

The flow of method 100 next includes an operation 110 in which a transistor is manufactured over the oxide layer. The transistor is manufactured over the oxide layer by performing manufacturing steps of depositing patterning material over the layer of semiconductor material, forming a pattern in the layer of patterning material, the pattern having exposed areas of the layer of semiconductor material and masked areas of the layer of semiconductor material, and adding dopants to exposed areas of the layer of semiconductor material. In some embodiments, the patterning material includes a material such as photoresist or other semiconductor patterning material. In some embodiments, forming a pattern in the layer of patterning material includes photolithography, electron-beam lithography, and/or another method of pattern transfer for forming wells and channels in a layer of semiconductor material. In some embodiments, adding dopants to the exposed areas of the layer of semiconductor material is performed by implantation from an implant source into the layer of semiconductor material. In some embodiments, adding dopants to the exposed areas of the layer of semiconductor material is performed by depositing an epitaxial layer of semiconductor dopant (e.g., a doped semiconductor material with a high concentration of dopant) over the layer of semiconductor material and annealing the epitaxial layer of semiconductor dopant to drive the dopant into the layer of semiconductor material.

According to some embodiments, manufacturing the transistor over the oxide layer is performed after manufacturing a thermal substrate contact against a top surface of the substrate. A planarization step performed after adding dopants to the layer of semiconductor material removes an upper portion of the layer of semiconductor material containing dopants for the source well, the drain well, or the doped regions next to the channel in the layer of semiconductor material. Planarizing the layer of semiconductor material after adding dopant introduces uncertainty in the amount of dopant in the layer of semiconductor material. Planarizing the layer of semiconductor material before adding dopant ensures that the dopants added to the layer of semiconductor material are not removed during, e.g., a planarization step. A thermal substrate contact is protected from dopants added to the layer of semiconductor material by the layer of patterning material over the top surface of the layer of semiconductor material. Once the thermal substrate contact is manufactured against the surface of the substrate, and the dopants are added to the layer of semiconductor material, manufacturing the transistor and the integrated circuit proceeds.

In some embodiments, an order of operations of method 100 is altered. For example, in some embodiments, operation 110 is performed before operation 108. In some embodiments, at least one operation of method 100 is omitted. For example, in some embodiments, operation 106 is omitted. In some embodiments, additional operations are included in method 100. For example, in some embodiments, a heat sink is attached to a surface of the substrate opposite the transistor.

Figure 2:
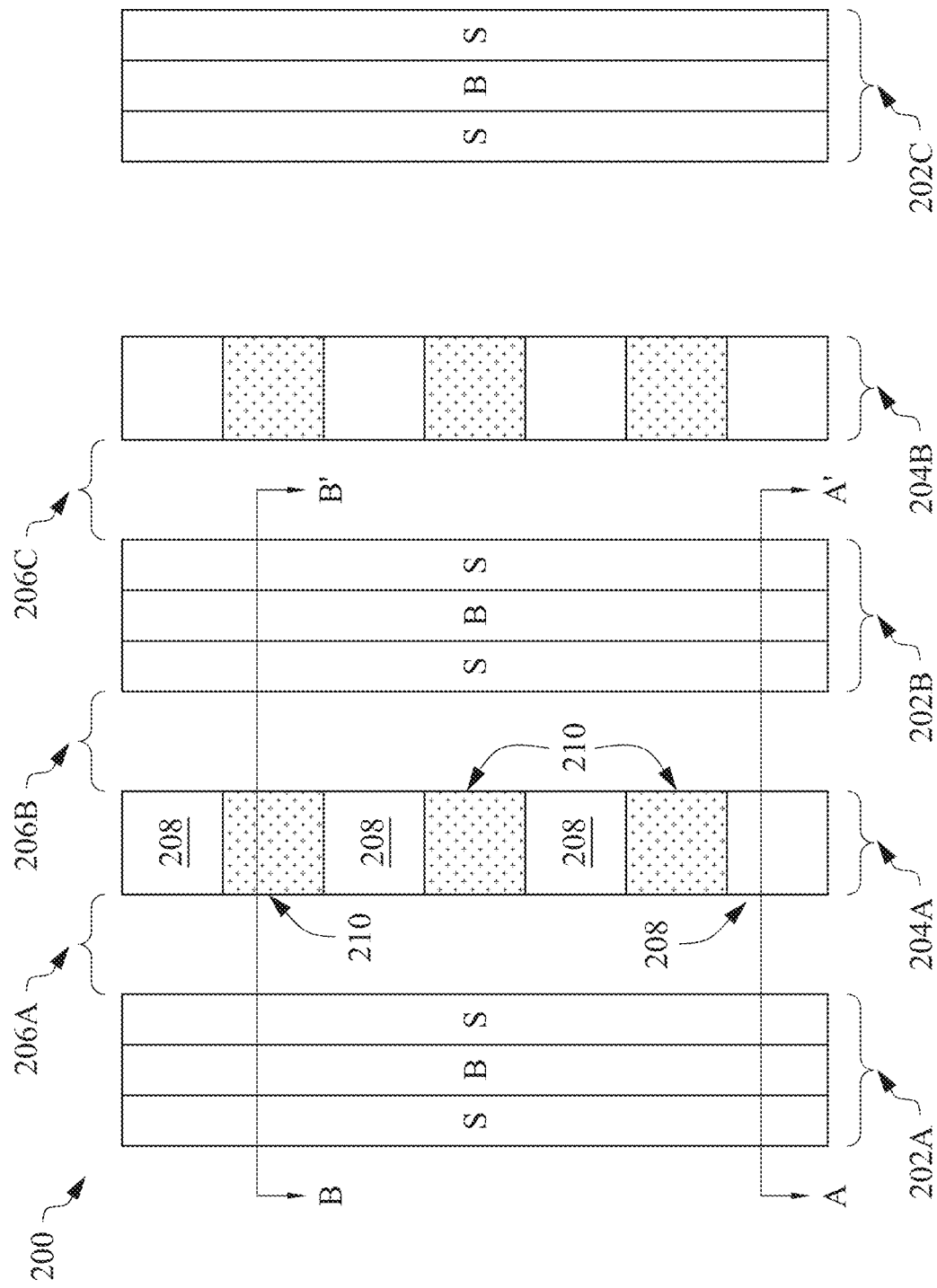
FIG. 2 is a top view of an integrated circuit having thermal substrate contacts, in accordance with some embodiments.

FIG. 2 is a top view of an integrated circuit 200 having thermal substrate contacts, in accordance with some embodiments.

In FIG. 2, source regions 202A, 202B, and 202C, and drain regions 204A and 204B, are part of a layer of semiconductor material deposited over an oxide layer. Cross sectional line A-A' extends across source region 202A, drain region 204A, and source region 202B, including an N-doped well (an N-well) 208 in the drain region 204A. Cross-sectional line B-B' extends across source region 202A, drain region 204A, and source region 202B, including a thermal substrate contact 210 in the drain region 204A. Source regions 202A, 202B, and 202C include source wells (S) (e.g., portions of a doped well in the layer of semiconductor material) and barriers (B) between the source wells in a source region. Thermal substrate contacts 210 alternate with N-doped wells (N-wells) in the drain region 204A. A pattern of N-wells and thermal substrate contacts in drain region 204B is similar to the pattern of N-wells 208 and thermal substrate contacts 210 in drain region 204A. N-wells are formed according to the method described above in operation 110. Thermal substrate contacts 210 are manufactured according to the method described above in operation 108.

Figure 3:
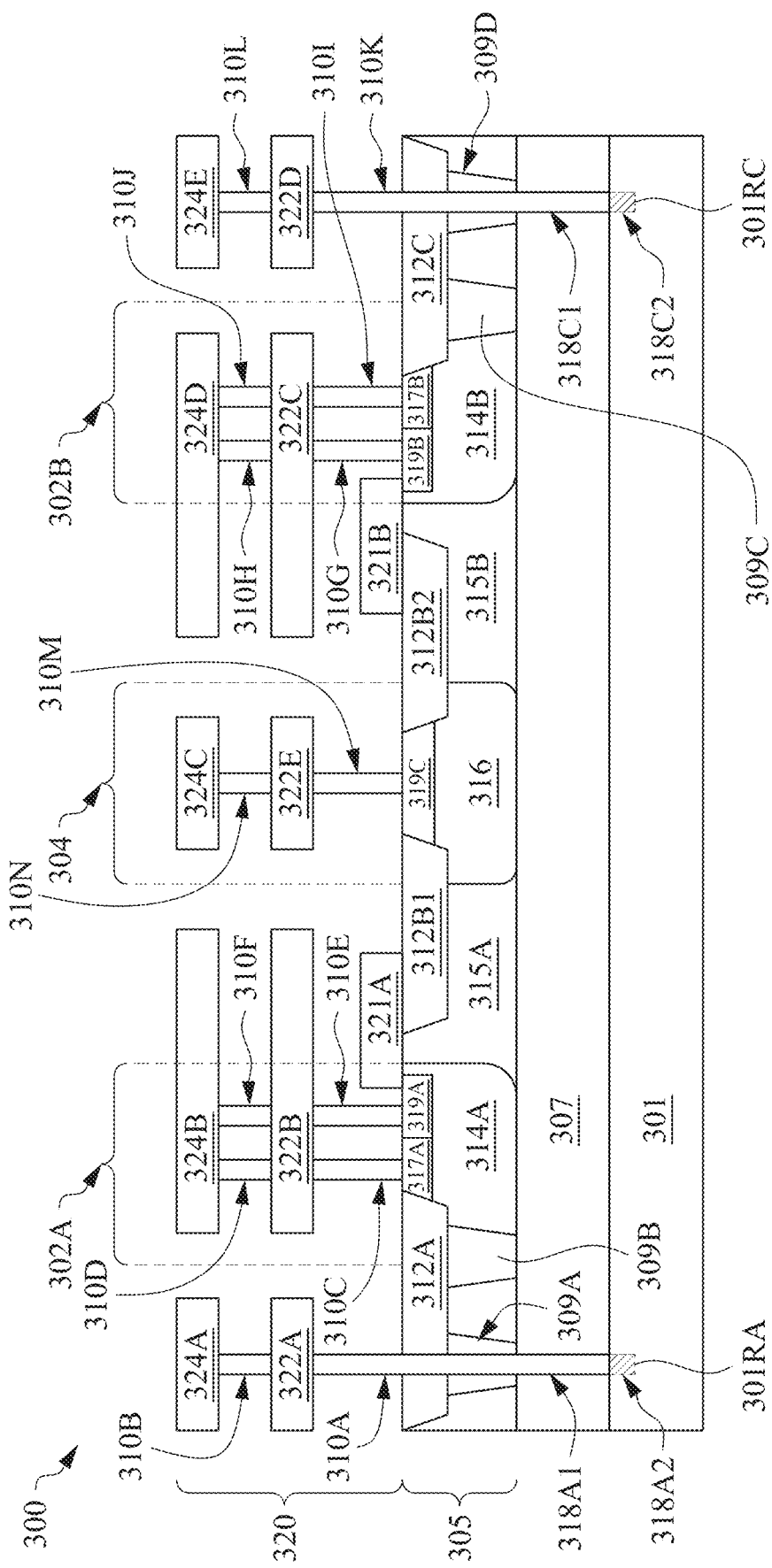
FIG. 3 is a cross-sectional view of an integrated circuit, in accordance with some embodiments.

FIG. 3 is a cross-sectional view of an integrated circuit 300, in accordance with some embodiments. Elements of integrated circuit 300 correspond to elements of FIG. 2 along cross-sectional line A-A', incremented by 100.

In FIG. 3, source region 302A and source region 302B are separated by drain region 304 in layer of semiconductor material 305. Oxide layer 307 is above substrate 301, and layer of semiconductor material 305 is above oxide layer 307. Layer of semiconductor material 305 includes STI 312A, STI 312B, and STI 312C. Layer of semiconductor material 305 includes DTI 309A, DTI 309B, DTI 309C, and DTI 309D. STI 312A, STI 312B, and STI 312C extend partway through layer of semiconductor material 305. DTI structures 309A and 309B extend below STI 312A, and DTI 309C and DTI 309D extend below STI 312C. In integrated circuit 300, DTI 309A-309D extend completely through the layer of semiconductor material 305 to a top surface of oxide layer 307. In some embodiments, deep trench isolation structures extend below shallow trench isolation structures, but do not extend completely to an underlying layer such as the oxide layer over the substrate. Layer of semiconductor material 305 includes P-doped wells 314A and 314B, and N-doped well 316. In integrated circuit 300, P-doped well 314A is in direct contact with STI 312A and DTI 309B. P-doped well 314A is also in direct contact with a high voltage N-well (HVNW) 315A. In layer of semiconductor material 305, N-doped well 316 is between HVNW 315A and HVNW 315B. P-doped well 314B and N-doped well 316 are on opposite sides of HVNW 315B in layer of semiconductor material 305. In some embodiments, the dopant concentration of N-type dopants in N-doped well 316 is the same as the dopant concentration of P-type dopants in P-doped well 314A and P-doped well 314B. In some embodiments, the dopant concentration of the N-type dopant in N-doped well 316 is greater than the concentration of P-type dopants in P-doped wells 314A and 314B. In some embodiments, the dopant concentration of the N-type dopant in N-doped well 316 is less than the concentration of P-type dopants in P-doped wells 314A and 314B. HVNW 315A and HVNW 315B have a different dopant concentration than N-doped well 316 and P-doped wells 314A and 314B. In some embodiments, HVNW 315A and HVNW 315B are doped with N-type dopants such that the wells have an N-type dopant concentration which is greater than the N-type dopant concentration in the N-doped well 316. HVNW 315A and HVNW 315B are doped with larger N-type dopant concentrations in order to reduce leakage current between the source wells and the drain well of a transistor.

P-doped region 317A is situated in P-doped well 314A, and P-doped region 317B is situated in P-doped well 314B. P-doped regions 317A-B have higher P-type dopant concentrations than P-doped wells 314A and 314B. N-doped region 319A is situated in P-doped well 314A next to P-doped region 317A. N-doped region 319B is situated in P-doped well 314B next to P-doped region 317B. P-doped regions 317A and 317B serve to create a P/N junction in the P-doped wells 314A and 314B across which current flows upon application of a voltage to the drain or source regions of the integrated circuit transistor. In some embodiments, the dopant types described hereinabove are reversed: e.g., wells or regions described above as having P-type dopants have, instead, N-type dopants, and wells or regions described above as having N-type dopants have, instead, P-type dopants.

Wells and/or regions having dopant concentrations different than a dopant profile/concentration in the substrate (e.g., substrate 301), undergo at least one dopant addition process to enrich the well and/or region with a different dopant profile/concentration than the substrate. In some embodiments, the dopant addition process includes deposition of a patterning material over the layer of semiconductor material, transferring a pattern to the layer of patterning material, and epitaxial deposition of a thin layer of a dopant-rich semiconductor material. Dopant addition using epitaxial deposition of a thin layer of dopant-rich semiconductor material further includes an operation of thermally treating the thin layer of dopant-rich semiconductor material to diffuse dopants from the dopant-rich semiconductor material into the underlying layer of semiconductor material, followed by a patterning material removal process to expose the top surface of the layer of semiconductor material for [1] additional dopant addition processes, or [2] further transistor manufacturing operations (e.g., manufacturing of a gate dielectric, manufacturing of a gate electrode, deposition of a dielectric layer, formation of contacts through the dielectric layer to source/drain regions, and so forth). In some embodiments, the dopant addition process includes deposition of a patterning material over the layer of semiconductor material, transferring a pattern to the layer of patterning material, and implantation of dopant atoms into the layer of semiconductor material through openings in the patterned layer of patterning material. In some embodiments, a dopant addition process which includes implantation of dopant atoms into the layer of semiconductor material through openings in the patterned layer of patterning material, a patterning material removal process follows dopant implantation. In some embodiments, patterning material removal processes includes a solvent-based treatment of the patterning material to soften and lift the patterning material from the top surface of the layer of semiconductor material. In some embodiments, patterning material removal processes include a plasma-based removal process having oxygen-based plasma to react with the patterning material. In some embodiments, after a patterning material removal process, a top portion of the layer of semiconductor material is removed to expose unoxidized semiconductor material. Oxidized semiconductor material in the source and/or drain region, or in the channel region of the transistor, increases resistance of the transistor, increasing the electrical current used to operation the transistor. In some embodiments, unremoved oxidized material in the source/drain and/or channel regions of a transistor makes the transistor inoperable because the oxidized material blocks a flow of electrical current through the transistor.

An interconnection structure 320 is over a top surface of layer of semiconductor material 305. Interconnection structure 320 includes conductive vias 310A-310N, conductive lines 322A-322E, and conductive lines 324A-324E. Conductive vias 310C-310F are part of interconnections over source region 302A, conductive vias 310G-310I are part of interconnections over source region 302B, and conductive vias 310N and 310M are interconnections over drain region 304. Conductive vias 310A-310B and 310K-310L are conductive vias outside of source regions 302A and 302B, and drain region 304. Conductive lines 322E and 324C are part of the interconnection structure over drain region 304. Conductive via 310N connects conductive line 324C to conductive line 322E, and conductive via 310M connects conductive line 322E to N-doped region 319C between STI 312B1 and STI 312B2. N-doped region 319C is between STI 312B1 and 312B2, and above N-doped well 316. Conductive via 310C electrically connects to a P-doped region 317A at the top level of the layer of semiconductor material, and conductive via 310E electrically connects to an N-doped region 319A at the top of P-doped well 314A. Conductive via 310G electrically connects to an N-doped region 319B at the top of P-doped well 314B, and conductive via 310I electrically connects to a P-doped region 317B at the top of P-doped well 314B. Gate electrode 321A extends from a top surface of STI 312B1 toward N-doped region 319A, and gate electrode 321B extends from a top surface of STI 312B2 toward N-doped region 319B. In some embodiments, the gate electrode is a polysilicon gate electrode. In some embodiments, the gate electrode includes a polysilicon material with a metal silicide on a surface thereof. In some embodiments, the gate electrode is another electrically conductive material (e.g., a semiconductor material or metal silicide).

P-doped region 317A is between N-doped region 319A and STI structure (STI) 312A. P-doped region 317B is between N-doped region 319B and STI 312C. In integrated circuit 300, thermal substrate contact 318A1 extends through STI 312A and DTI 309A. Thermal substrate contact 318A1 extends from a top surface of layer of semiconductor material 305 (or, a top surface of STI 312A), through the layer of semiconductor material 305, through the oxide layer 307, to a top surface of substrate 301. Thermal substrate contact 318C1 extends through STI 312C and DTI 309D. Thermal substrate contact 318C1 extends from a top surface of layer of semiconductor material 305 (or, a top surface of STI 312C), through the layer of semiconductor material 305, through the oxide layer 307, to a top surface of substrate 301. Thermal substrate contact 318A1 has a portion 318A2 which extends into a recess 301RA into the substrate 301. Thermal substrate contact 318C1 has a portion 318C2 which extends into a recess 301RC into the substrate 301.

In some embodiments, thermal substrate contact 318A is formed in a single manufacturing operation (e.g., an operation which includes steps related to etching an opening through STI 312A and DTI 309A as the layer extend through layer of semiconductor material 305, and oxide layer 307, and relating to filling the opening with thermally conductive material in a single filling process). In some embodiments, thermal substrate contact 318A is formed in multiple manufacturing operations, in which steps related to etching openings and filling the openings are repeated for each layer (e.g., once for a layer of semiconductor material, and once for an oxide layer). In some embodiments, the thermal substrate contact is made of a metallic material such as tungsten (W), cobalt (Co), titanium (Ti), platinum (Pt), nickel (Ni), and alloys thereof. In some embodiments, the thermal substrate contact is made of silicon or a semiconductor material. In some embodiments, the thermal substrate contact material is deposited by epitaxial growth. In some embodiments, the thermal substrate contact material is deposited by sputtering material from a sputtering target. In some embodiments, thermal substrate contact material is different from the electrically-conductive material of the contacts connected to the source or drain regions of the integrated circuit transistors. In some embodiments, a thermal substrate contact is "thermally" connected to the interconnection structure of an integrated circuit by manufacturing a metallic contact similar to a source/drain contact, in direct contact with the top surface of the thermal substrate contact. In some embodiments, thermal substrate contacts include column-like structures extending to the substrate of the integrated circuit. In some embodiments, thermal substrate contacts include bar-like structures extending to the substrate of the integrated circuit (e.g., resulting from formation of a deep trench and filling the deep trench with thermally conductive material).

Heat generated by electrical current flowing through transistors of integrated circuit 300 flows away from the source of the heat generation. In embodiments of integrated circuits having an insulating oxide layer between the layer of semiconductor material having the transistor wells (e.g., source wells and drain wells) and no thermal substrate contact, the heat generated flows up through the interconnection structure of the integrated circuit at a high rate (because the interconnection structure includes metal contacts, vias, conductive lines, and top pads or solder bumps), and down through the oxide layer (e.g., the buried oxide layer) at a low rate (because the oxide layer has a low thermal conductivity with respect to the thermal conductivity of the metal of the interconnection structure). A thermal substrate contact promotes thermal conductivity between the substrate and the interconnection structure of an integrated circuit by providing a thermal bridge between the substrate and the interconnection structure. The thermal substrate contact has a larger thermal conductivity than the oxide layer through which the contact extends.

In some embodiments, in addition to providing a thermal bridge for heat to travel between the layer of semiconductor material and the substrate, a thermal substrate contact is configured to apply a voltage to the substrate near a transistor to reduce noise, or to regulate the operation of the transistor gates. For example, thermal substrate contact 318A1 in integrated circuit 300 is electrically connected to a conductive via 310A. A voltage applied to conductive via 310A is transmitted through thermal substrate contact 318A1 to substrate 301, tying the substrate near recess 301RA to the applied voltage source. Similarly, thermal substrate contact 318C1 is electrically connected to a conductive via 310K. A voltage applied to conductive via 310K is transmitted through thermal substrate contact 318C1 to substrate 301, tying the substrate near recess 301RC to the applied voltage source. In some embodiments, a fixed voltage is applied to the substrate near/below a transistor through the thermal substrate contact and the interconnection structure to decrease electrical noise in the integrated circuit. and/or to decrease the influence of an unregulated-voltage applied to the substrate on the transistor and/or and to regulate transistor performance. Unregulated voltages applied to the substrate have a capacitive effect on the layer of semiconductor material, which increases a likelihood of disruption of operation of the transistors because of the influence of the biased substrate (as one plate of a capacitor) on the layer of semiconductor material (as the other plate of a capacitor). In some embodiments, the substrate receives a positive voltage from the IC interconnection structure through the thermal substrate contact. In some embodiments, the substrate receives a negative voltage from the IC interconnection structure through the thermal substrate contact. In some embodiments, the substrate is connected to a reference voltage $V_{ss}$. In some embodiments, the substrate is connected to an operation voltage $V_{dd}$. In some embodiments, the substrate is connected to ground. In some embodiments, the voltage applied to the substrate is between $V_{dd}$ and $V_{ss}$. In some embodiments, the substrate is electrically connected to the IC interconnection structure by a thermal substrate contact, and the connected voltage (or, the substrate voltage) is allowed to float.

Figure 4:
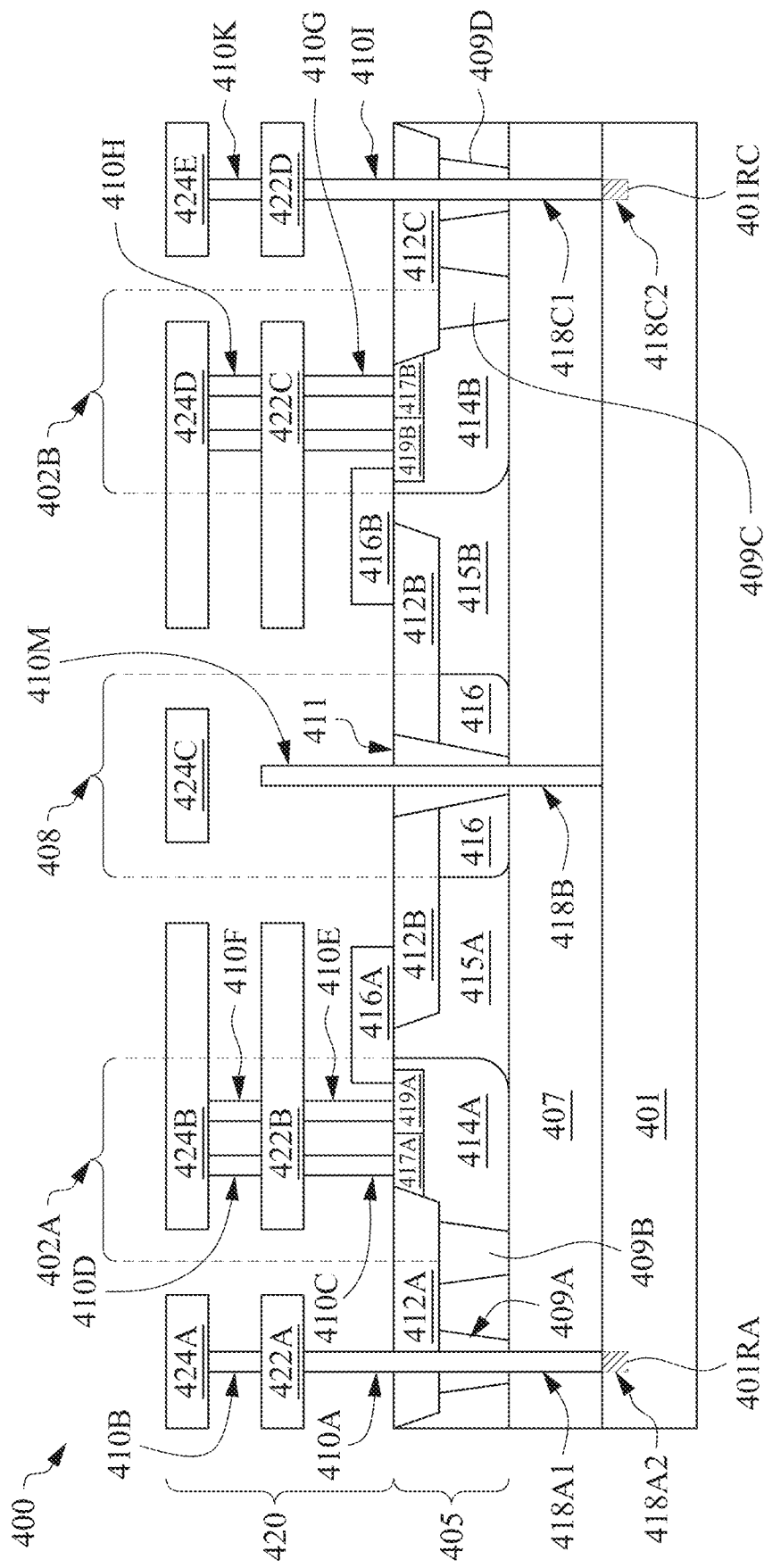
FIG. 4 is a cross-sectional view of an integrated circuit, in accordance with some embodiments.

FIG. 4 is a cross-sectional view of an integrated circuit 400, in accordance with some embodiments. Elements of integrated circuit 400 correspond to elements of FIG. 2 along cross-sectional line B-B', incremented by 200; or elements of FIG. 3 incremented by 100.

In integrated circuit 400, thermal substrate contact 418A1 and thermal substrate contact 418C1 are source-region thermal substrate contacts, extending to the substrate near the source region of the transistor. In integrated circuit 400, thermal substrate contact 418A1 extends through layer of semiconductor material 405 next to source well 402A, and oxide layer 407 to the top surface of substrate 401 through STI 412A and DTI 409A. Thermal substrate contact 418C1 extends through layer of semiconductor material 405 next to source well 402B, and oxide layer 407 to the top surface of substrate 401 through STI 412C and DTI 409D. Thermal substrate contacts 418A1 and 418C1 extend from the top of the P-wells 414A and 414B in the layer of semiconductor material 405 to below the bottom of the P-wells 414A and 414B. The thermal substrate contact 418A1 extends through STI 412A. Thermal substrate contact 418D is a drain-region thermal substrate contact, which extends through the N-well 416 in layer of semiconductor material 405 to the top surface of the substrate 401. Sleeve 411 surrounds thermal substrate contact 418B in the layer of semiconductor material 405. A bottom edge of the thermal substrate contact 418B is directly against the top surface of the substrate 401. A bottom edge of sleeve 411 is directly against the top surface of oxide layer 407. A bottom edge of the thermal substrate contact 418B extends through an entirety of the oxide layer 407. In some embodiments, thermal substrate contact 418B extends partially into substrate 401 (not shown).

In some embodiments, sleeve 411 is a layer of thermally conductive material deposited into an opening in the layer of semiconductor material 605 to increase thermal conductivity of heat downward toward the substrate 601 of the integrated circuit. In some embodiments, thermally conductive material used in sleeve 411 includes silicon, silicon germanium, or a semiconductor material similar to the material of the layer of semiconductor material 405. In some embodiments, thermally conductive material used in sleeve 411 includes tungsten (W), cobalt (Co), titanium (Ti), platinum (Pt), nickel (Ni), and alloys thereof. The thermally conductive material of sleeve 411 has a thermal conductivity greater than the thermal conductivity of the oxide layer (e.g., oxide layer 407). In some embodiments, the thermal conductivity of the material of sleeve 411 is approximately the same as the thermal conductivity of the substrate. In some embodiments, the material of sleeve 411 is a metal nitride, where the metal includes tungsten (W), cobalt (Co), titanium (Ti), platinum (Pt), nickel (Ni), and alloys thereof. Using, for a metallic thermal substrate contact, a metal nitride layer having a same metal type as the thermal substrate contact, the adhesion of the thermal substrate contact metal with the liner (e.g., the metal nitride layer) is improved, and filling is more likely to occur without voids in the thermal substrate contact. Voids in the thermal substrate contact reduce the thermal conductivity of the thermal substrate contact by reducing the cross-sectional area of metal in the thermal substrate contact. In embodiments of the sleeve which include a dielectric material, the sleeve material is deposited by, e.g., chemical vapor deposition, physical vapor deposition, and/or processing of exposed semiconductor material with oxygen to grow native oxide. According to some embodiments, the sleeve 411 and the thermal substrate contact 418B are electrically isolated from the integrated circuit, and function as a "heat pipe" to conduct thermal energy through the oxide layer 407 and into substrate 401.

In some embodiments, a thermal substrate contact extends into a recess in the substrate 401. In some embodiments of thermal substrate contacts which extend into recesses in the substrate, the thermal conductivity is higher than for thermal substrate contacts which do not extend into a recess in the substrate. The increased thermal conductivity results from the increased area of thermal substrate contact material against the substrate to conduct heat into the substrate. In some embodiments, some thermal substrate contacts extend into recesses in the substrate, and some thermal substrate contacts are directly against a top surface of the substrate. The presence or absence of a recess in the substrate below a thermal substrate contact is related to the films/materials through which the thermal substrate contact opening extends. In integrated circuit 400, the drain-region thermal substrate contact 418B is directly against a top surface of substrate 401, while source-region thermal substrate contact 418A1 and source-region thermal contact substrate 418C1 have portions (e.g., portion 418A2 and portion 418C2), which extend into recesses in the substrate 401. According to some embodiments, a drain-region thermal substrate contact (see thermal substrate contact 418A1) extends into a recess (see recess 401RA), while source-region thermal substrate contacts (see thermal substrate contact 418B) do not extend into a recess, but land on the surface of the substrate. Whether or not a thermal substrate contact extends into a recess is related to the profile of the materials through which the thermal substrate contact extends, the chemistry (wet etch or plasma etch) used to form the opening, and the dimensions (width) of the thermal substrate contacts in each region of the integrated circuit. In integrated circuit 400, portion 418A2 extends into recess 401RA, and portion 418C2 extends into recess 401RC. In integrated circuit 400, the etch process for forming thermal substrate contact openings was slightly selective to the semiconductor material of layer of semiconductor material 405 (e.g., the etch rate of layer of semiconductor material 405 and the oxide layer 407 in drain region 408 is slower than the combined etch rate of STI 412A and DTI 409A and oxide layer 407), allowing the thermal substrate contact openings for thermal substrate contacts 418A1 and 418C1 to form recesses 401RA and 401RC. In some embodiments, the combined etch rates of the source and drain regions are reversed (e.g., drain is faster, source is slower) from the present description of integrated circuit 400, and the recess is formed below thermal substrate contact of the drain region, rather than below the thermal substrate contacts near the source regions of the integrated circuit.

Figure 5:
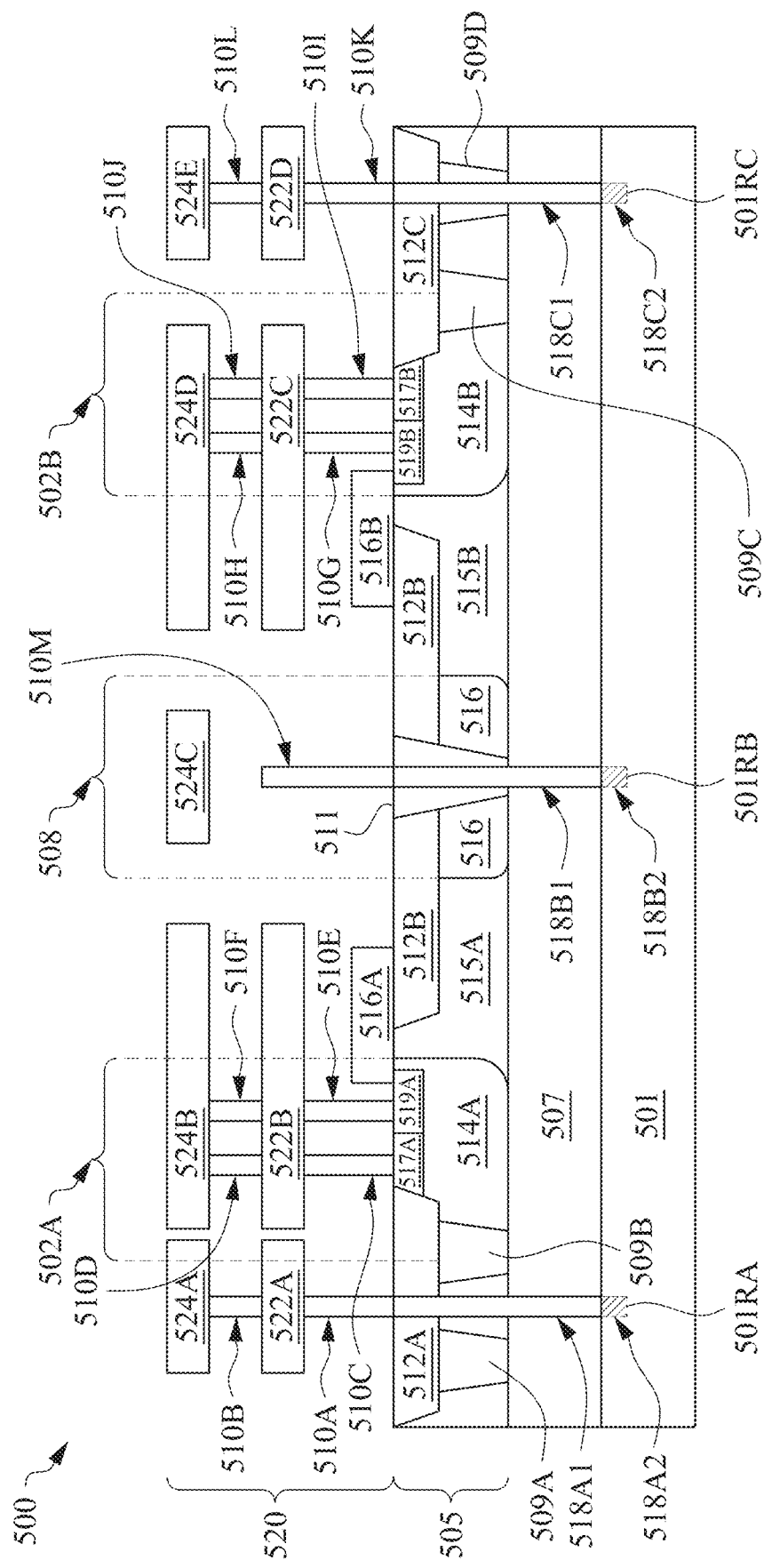
FIG. 5 is a cross-sectional view of an integrated circuit, in accordance with some embodiments.

FIG. 5 is a cross-sectional view of an integrated circuit 500, in accordance with some embodiments. Integrated circuit 500 has elements similar to elements of integrated circuit 400, as described above regarding FIG. 4. Elements of integrated circuit 500 which are similar to integrated circuit 400 in FIG. 4 have a same identifying reference, incremented by 100 for clarity. Differences between integrated circuit 400 and integrated circuit 500 are described below.

In integrated circuit 500, conductive via 510A aligns with thermal substrate contact 518A at a top surface of the STI 512A (corresponding to the top surface of layer of semiconductor material 505), and thermal substrate contact 518A extends through STI 512A and through layer of semiconductor material 505 below STI 512A, and is separated from DTI 509A and 509B by part of the layer of semiconductor material 505 (see also thermal substrate contact 518C1 which extends through DTI 509D near source region 502B). DTI 506D surrounds a first portion of thermal substrate contact 518C1, and STI 512C surrounds a second portion of thermal substrate contact 518C1, such that thermal substrate contact 518C1 is physically separated from the layer of semiconductor material 505. Thermal substrate contact 518C1 is in direct contact with oxide layer 507, and in direct contact with substrate 501.

In some embodiments, the thermal substrate contact makes partial contact with one or more DTI structures extending through the layer of semiconductor material, and makes partial contact with the layer of semiconductor material. In some embodiments, the thermal substrate contact is directly against multiple DTI structures extending through the layer of semiconductor material. In some embodiments, only one DTI is against the thermal substrate contact. In some embodiments, the DTI is against the thermal substrate contact for an entirety of the portion of the thermal substrate contact passing through the layer of semiconductor material. In some embodiments, the DTI is against the thermal substrate contact for an entirety of the height of the thermal substrate contact passing through the layer of semiconductor material below a bottom interface between the STI in the layer of semiconductor material.

Conductive via 510M is above the top surface of sleeve 511 and above the top surface of layer of semiconductor material 505. In some embodiments, the sleeve is a deep trench isolation structure. In some embodiments, the sleeve is a layer of material having a thermal conductivity greater than the thermal conductivity of the oxide layer. In some embodiments, the sleeve is formed at the same time the thermal substrate contact is being filled.

In some embodiments, thermal substrate contacts extend entirely through isolation structures (DTI, or STI and DTI) and the oxide layer of an integrated circuit. In some embodiments, thermal substrate contacts extend through an STI, the layer of semiconductor material, and the oxide layer of the integrated circuit (separated from any DTI in the integrated circuit). In some embodiments, the thermal substrate contacts extend through the entire layer of semiconductor material and the entire layer of oxide material of the integrated circuit (separated from any STI or DTI of the integrated circuit). In integrated circuit 400, described above, thermal substrate contact 418A1 extends through STI 412A, DTI 409A, and oxide layer 407, thermal substrate contact 418B extends through sleeve 411 and oxide layer 407, and thermal substrate contact 418C1 extends through STI 412C, DTI 409D, and oxide layer 407. STI 412A and DTI 409A, combined, extend through an entire width of layer of semiconductor material 405. In some embodiments, the STI and DTI also extend down into the oxide layer 407. STI 412C and DTI 409C, combined, extend through an entire width of layer of semiconductor material 405. In some embodiments, the STI and DTI also extend down into the oxide layer 407. In integrated circuit 500, thermal substrate contact 518A1 extends through STI 512A, layer of semiconductor material 505, and oxide layer 507 into the recess 501RA; thermal substrate contact 518C1 extends through STI 512C, DTI 509D, oxide layer 507, and into recess 501RC; and thermal substrate contact 518B1 extends through sleeve 511, and oxide layer 507 into recess 501RB in substrate 501. The portion of substrate contact 518B 1 which extends into recess 501RB is portion 518B2, and is in direct contact with substrate 501. In some embodiments, all the thermal substrate contacts of the integrated circuit are formed through the layer of semiconductor material (e.g., through a shallow trench isolation structure and the underlying semiconductor material of the layer of semiconductor material).

A thermal substrate contact extending through and having a portion thereof directly against the layer of semiconductor material is more efficient at conducting heat away from the layer of semiconductor material than a thermal substrate contact having a sidewall directly against dielectric materials of a shallow trench isolation or deep trench isolation structure. Thermal conductivity efficiency of a thermal substrate contact increases with the amount of surface of area against the substrate and/or layer of semiconductor material because semiconductor materials and substrate materials have a higher thermal conductivity than dielectric materials of isolation structures. In some embodiments, positions of thermal substrate contacts through both epi (semiconductor material) layers and oxide layers (e.g., STO, DTI, oxide layer) are adjusted during a layout phase of the integrated circuit in order to tailor the cooling characteristics of the integrated circuit near transistors which will operate with higher frequency than other transistors of the IC.

Figure 6A:
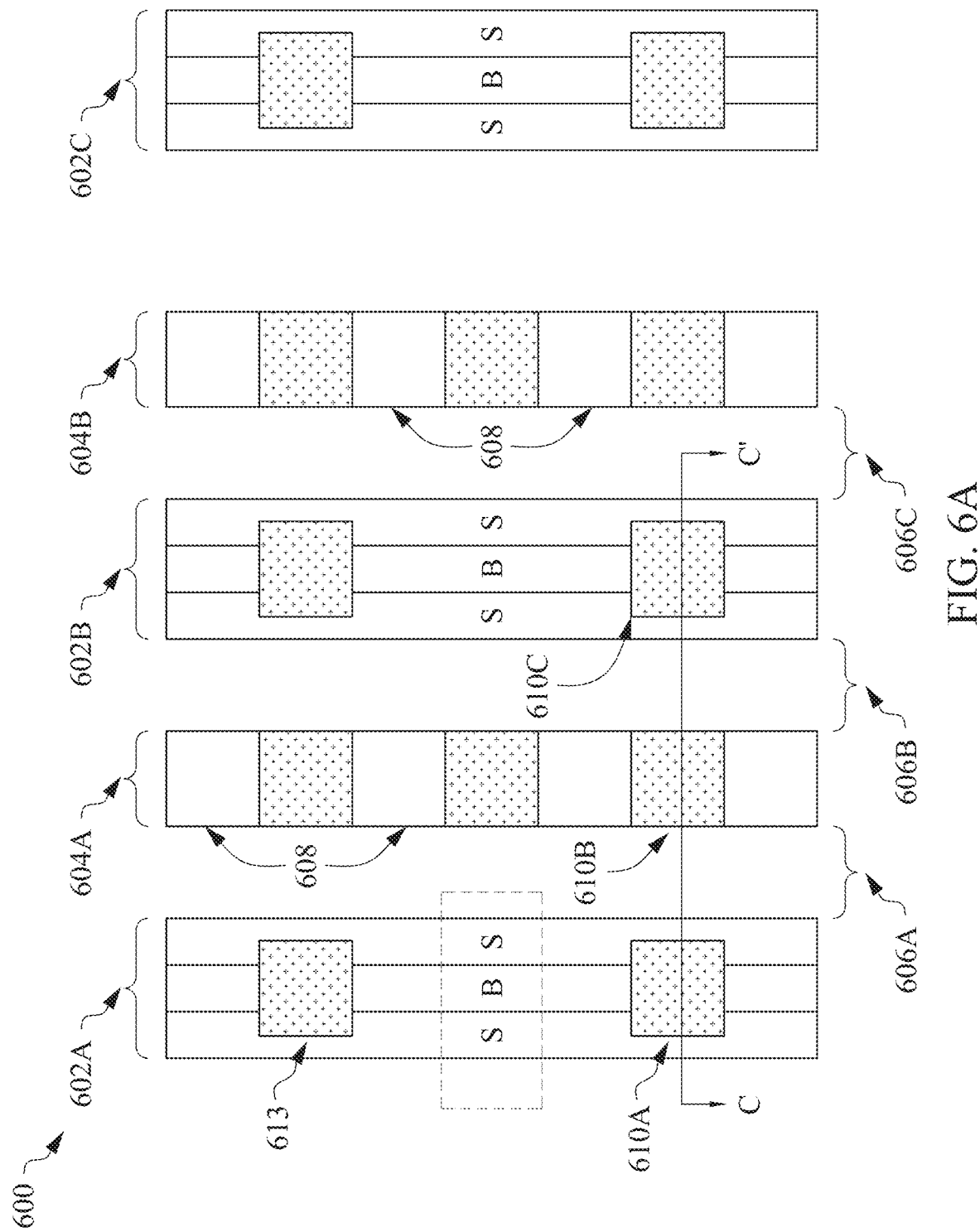
FIG. 6A is a top view of an integrated circuit having thermal substrate contacts, in accordance with some embodiments.

FIG. 6A is a top view of an integrated circuit 600 having thermal substrate contacts, in accordance with some embodiments. Elements of integrated circuit 600 which correspond to elements of integrated circuit 300 in FIG. 3 have a same identifying reference incremented by 300.

Cross sectional line C-C' extends through a source region 602A having therein a thermal substrate contact 618A, through active area regions 606A and 606B (having channels of an integrated circuit transistor located therein in the layer of semiconductor material), through thermal substrate contact 618B in drain region 604A, and through thermal substrate contact 618C in source region 602B. Each of source region 602A, source region 602B, and source region 602C, as well as drain regions 604A-B have more than one thermal substrate contact therein. In some embodiments, thermal substrate contacts are located only in source regions (see, e.g., source region 602A). In some embodiments, thermal substrate contacts are located only in drain regions of the integrated circuit (see, e.g., drain region 604A). In some embodiments, not all source regions (or, drain regions) have a same number of thermal substrate contacts. In some embodiments, each source region has a same number of thermal contacts as each other source region and each drain region. In some embodiments, at least one source region has a different number of thermal contacts from at least one other source region or at least one drain region. In some embodiments, some source regions have thermal substrate contacts, and other source regions have no thermal substrate contacts. In some embodiments, some drain regions have thermal substrate contacts, and other drain regions have no thermal substrate contacts.

Figure 6B:
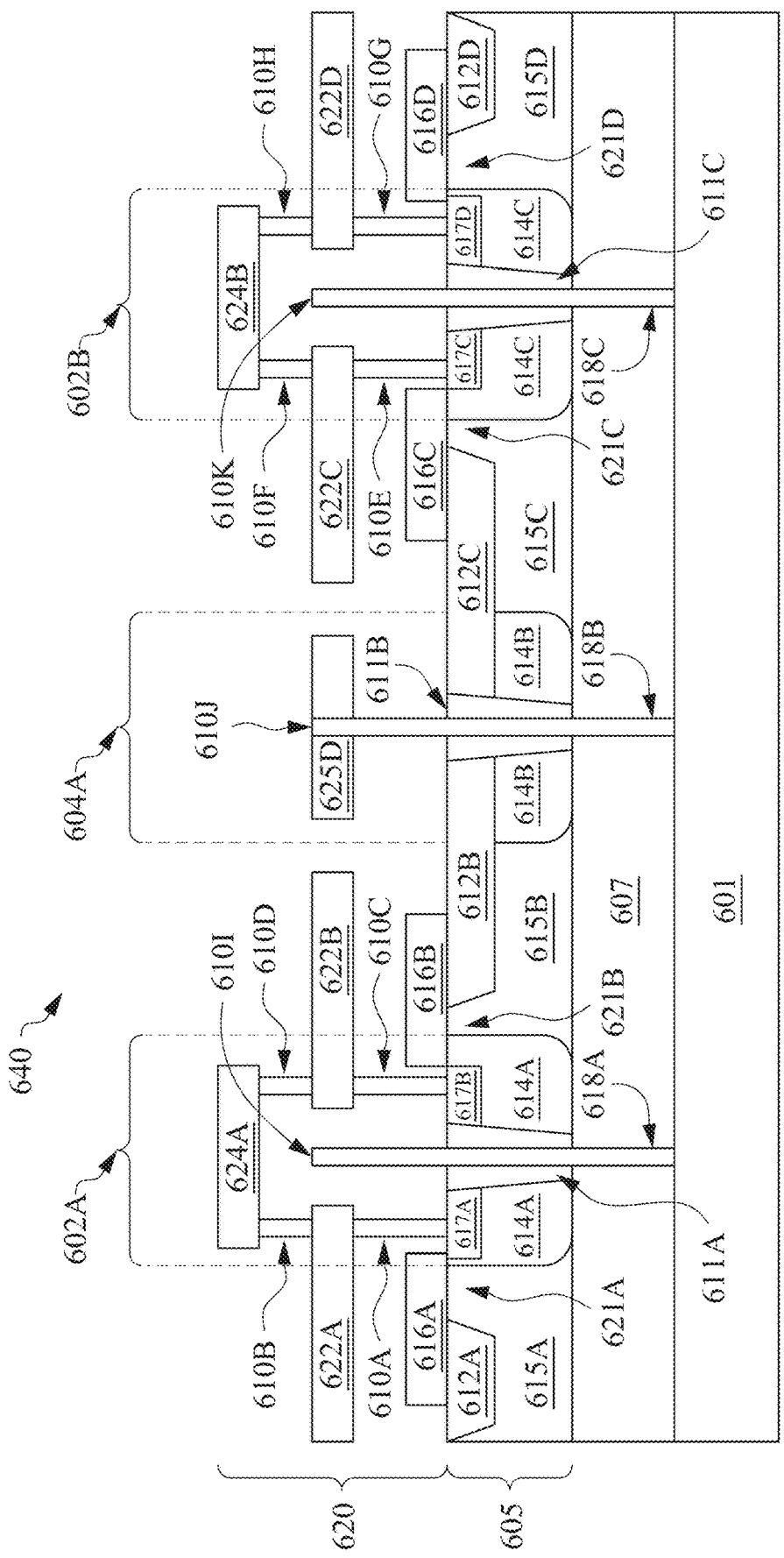
FIG. 6B is a cross-sectional view of an integrated circuit having thermal substrate contacts, in accordance with some embodiments.

FIG. 6B is a cross-sectional view of an integrated circuit 640 corresponding to the cross section C-C' of FIG. 6A, in accordance with some embodiments. Elements of integrated circuit 640 which correspond to elements of integrated circuit 300 in FIG. 3 have a same identifying reference, incremented by 300.

In integrated circuit 640, the source region 602A includes two N-doped regions 617A and 617B in P-doped well 614A. N-doped region 617A is on a same side of thermal substrate contact 618A as gate electrode 616A (and adjoins a channel 621A below gate electrode 616A). N-doped region 617B is on a same side of thermal substrate contact 618A as gate electrode 616B (and adjoins a channel 621B below gate electrode 616B). Similarly, N-doped region 617C is in P-doped well 614C on a same side of thermal substrate contact 618C as gate electrode 616C (and adjoins a channel 621C below gate electrode 616C). N-doped region 617D is in P-doped well 614C on a same side of thermal substrate contact 617C as gate electrode 616D, and adjoins a channel 621D below gate electrode 616D. Gate electrode 616A is against a top surface of STI 612A and over channel 621A, gate electrode 616B is against a top surface of STI 612B and over channel 621B, gate electrode 616C is against a top surface of STI 613C and over channel 621C, and gate electrode 616D is against a top surface of STI 612D and over channel 621D. According to some embodiments, the dopant patterns described hereinabove for integrated circuit are reverse, such that the wells are N-doped and the regions analogous to N-doped regions 617A-617D are P-doped.

Thermal substrate contact 618B extends through layer of semiconductor material 605 and is isolated from the HVNW 615B and HVNW 615C on either side of DTI 611B, such that thermal substrate contact 618B is electrically isolated from layer of semiconductor material 605 by DTI 611, and by oxide layer 607. While DTI 611A, 611B, and 611C extend down through the layer of semiconductor material 605, and down to oxide layer 607, in some embodiments, DTI extend down into oxide layer 607.

Thermal substrate contacts 618A and 618C provide increased capacity as compared to thermal substrate contacts 518A1 and 518C1 in integrated circuit 500 to conduct heat from the transistors in the layer of semiconductor material 605 because the thermal substrate contacts are not separated from the transistors by an isolation structure outside the well of the transistor. Thermal substrate contact 618A is separated from the well 614A by DTI 611A, which is in the well 614A. Thermal substrate contact 618C is separated from the well 614C by DTI 611C, which is in well 614C.

Channels 621A, 621B are part of a split gate transistor structure, where each of the two gates (e.g., gate electrodes 616A and 616B) is readied for operation by applying current through a single current path: conductive line 624A through conductive vias 610A and 610C, such that, upon activation of one or both of gate electrodes 616A or 616B, current is directed through a channel adjacent to the thermal substrate contact 618A. Channels 621C, and 621D are part of a second split gate transistor structure, and the two gates (e.g., gate electrodes 616C and 616D) are readied for operation by applying current through a single current path: conductive line 624B through conductive vias 610E and 610G, such that, upon activation of one or both of gate electrodes 616C or 616D, current is directed through a channel adjacent to the thermal substrate contact 618C. Drain well 614B is configured to receive current from either of channel 621B or 621C upon activation of the appropriate gate electrode. Conductive line 625D is electrically connected to a drain-region thermal substrate contact 618B. A top end of thermal substrate contact 618B is at the same level as the top of conductive line 625D.

Figure 7B:
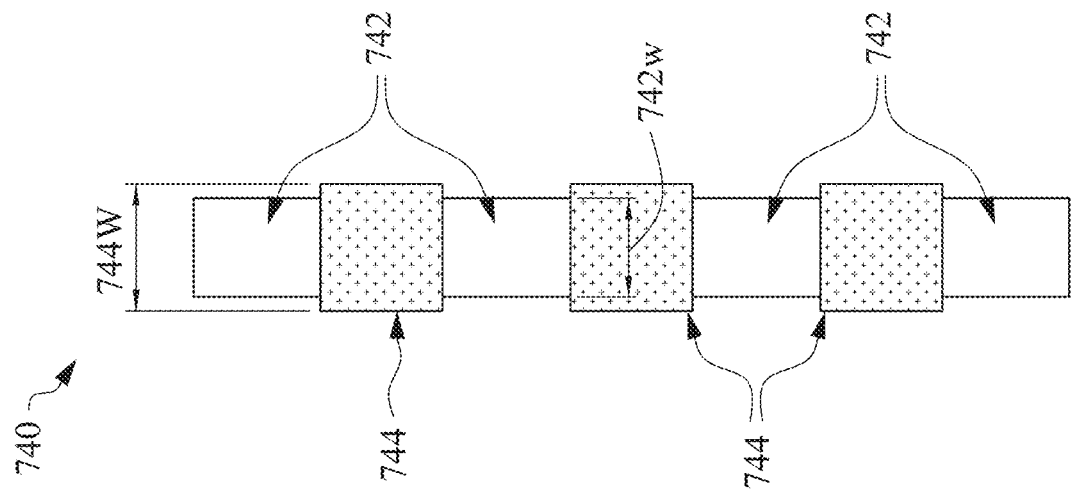
FIGS. 7A and 7B are top views of embodiments of an integrated circuit, in accordance with some embodiments.
Figure 7A:
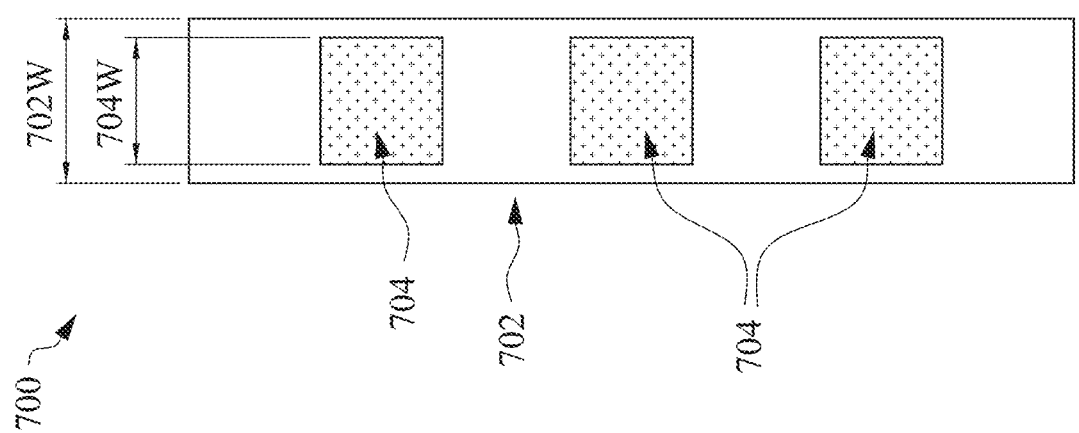

FIGS. 7A-7B are top views of embodiments of an integrated circuit 700, and an integrated circuit 740, in accordance with some embodiments. In FIG. 7A, an active area 702 (e.g., a drain region or a source region, as described hereinabove for FIGS. 2 and 6A) has thermal substrate contacts 704 situated within the active area. The active area 702 has a first width 702W. The thermal substrate contacts 704 have a contact width 704W. In FIG. 7A, thermal substrate contact width 704W is smaller than first width 702W of the active area 702, and the thermal substrate contacts 704 are laterally surrounded on four sides by the active area 702. According to some embodiments, a thermal substrate contact width is not less than 10% of the active area width. In some embodiments, the thermal substrate contact width is not greater than 110% of an active area width. In embodiments where the thermal substrate contact width is less than 10% of the active area width, the thermal substrate contact is difficult to fill without creating voids during a filling or deposition step to add the thermal substrate contact material in the opening. In embodiments where the thermal substrate contact width is greater than 110% of the active area width, the thermal substrate contact crowds the transistor channels or other features of the integrated circuit near the thermal substrate contact.

FIG. 7B is a top view of an integrated circuit 740 having therein an active area border region 742 and a plurality of thermal substrate contacts 744. Active area border region 742 has an active area border width 742W. Thermal substrate contacts 744 have a contact width 744W. In integrated circuit 740, active area border width 742W is smaller than or equal to contact width 744W. In some embodiments, the active area border 742 has openings in a top surface thereof which divide the top surface into separate discontinuous regions. In some embodiments, the thermal substrate contacts 744 divide the semiconductor material of the active area border into a plurality of portions of material which are completely separated from each other by the thermal substrate contacts extending therethrough. According to some embodiments, the thermal substrate contacts in an active area border have a contact width ranging from about 20% of the active area border width, up to more than 100% of the active area border width, as measured at the top surface of the active area border. Thermal substrate contacts having a contact width smaller than about 20% of the active area border width do not provide a sufficient path for removing heat from the substrate, or from the active area above the substrate, to appreciably increase the cooling capacity of an integrated circuit. Thermal substrate contacts having a contact width greater than 100% of the active area border width encroach on transistors or other elements of the integrated circuit in the layer of semiconductor material.

Figure 8:
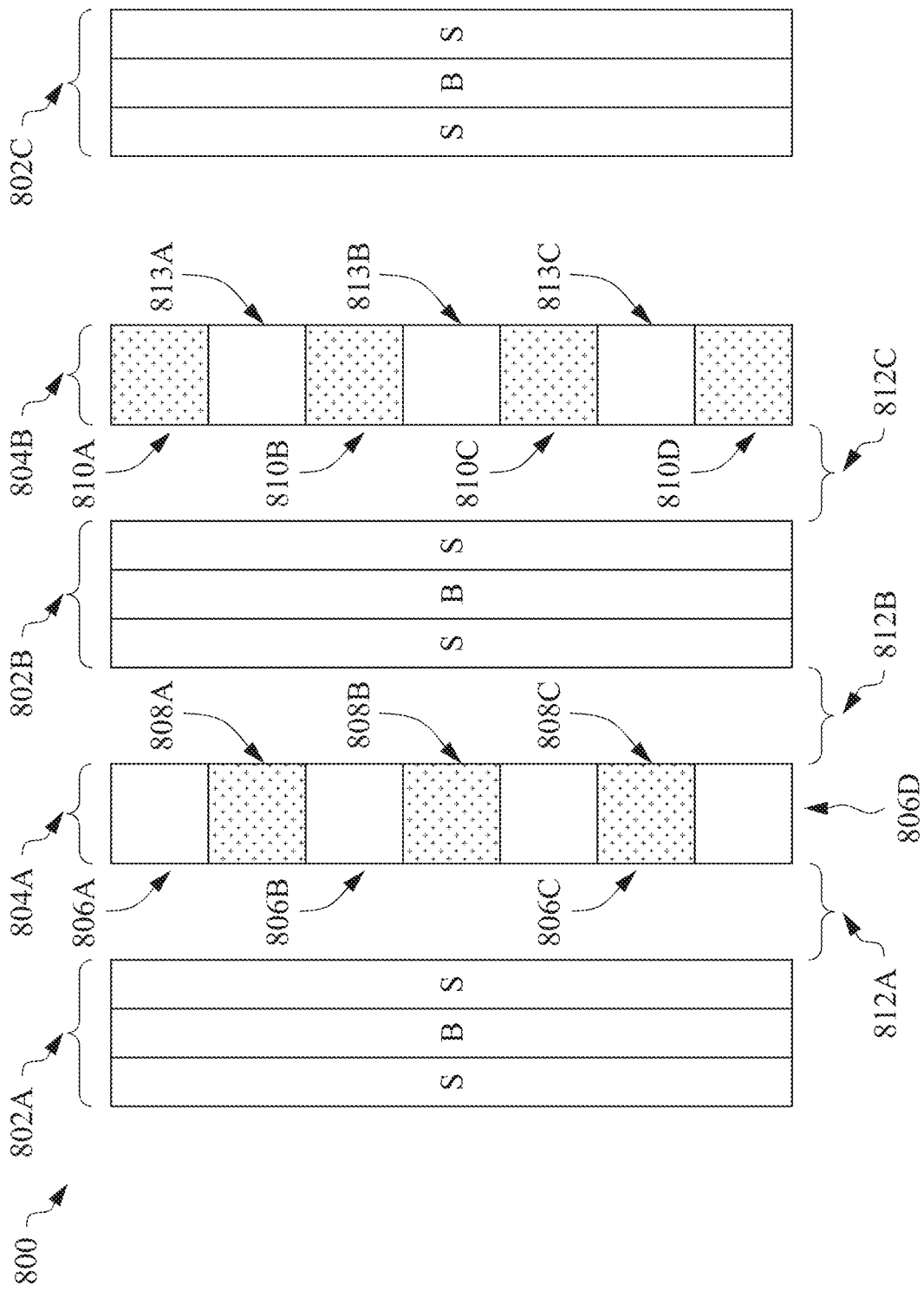
FIG. 8 is a top view of an integrated circuit, in accordance with some embodiments.

FIG. 8 is a top view of an integrated circuit 800, in accordance with some embodiments. Elements of integrated circuit 800 which are similar to elements of integrated circuit 200 in FIG. 2 are identified with a similar reference numeral, incremented by 600.

Integrated circuit 800 includes source regions 802A, 802B, and 802C, drain regions 804A and 804B, and active regions 812A-C. In integrated circuit 800, drain region 804A has three thermal substrate contacts 808A, 808B, and 808C at interior positions in the drain region. In drain region 804A, thermal substrate contact 808A separates N-well 806A from N-well 806B, thermal substrate contact 808B separates N-well 806B from N-well 806C, thermal substrate contact 808C separates N-well 806C from N-well 806D. N-wells 806A and 806D are terminal N-wells of the drain region 804A. In drain region 804B, N-wells 813A, 813B, and 813C are at interior positions of the drain region, and N-well 813A separates thermal substrate contact 810A from thermal substrate contact 810B, N-well 813B separates thermal substrate contact 810B from thermal substrate contact 810C, and N-well 813C separates thermal substrate contact 810C from thermal substrate contact 812D. Thermal substrate contacts 810A and 810D are terminal contacts of the drain region 804B.

Figure 9:
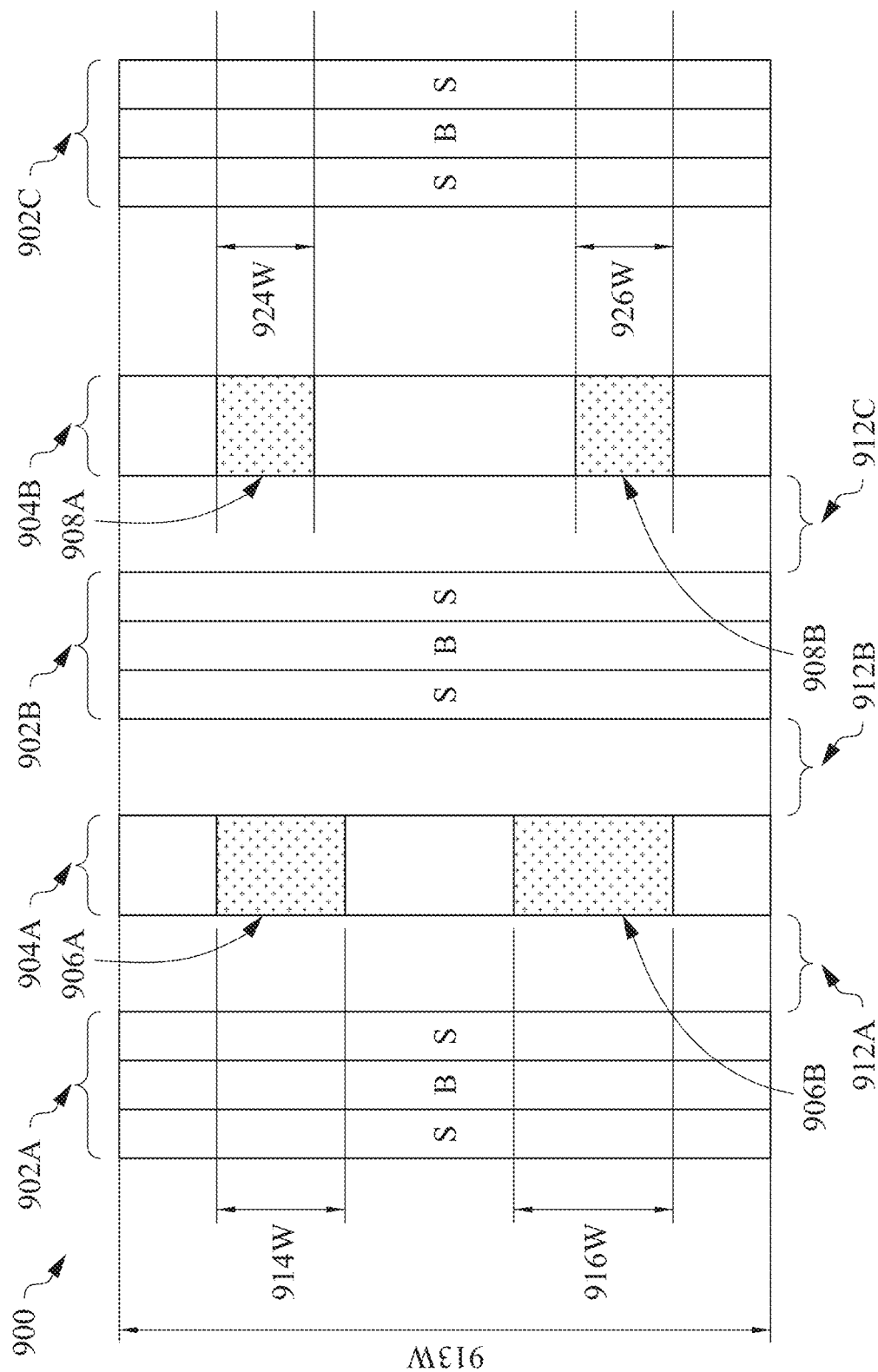
FIG. 9 is a top view of an integrated circuit, in accordance with some embodiments.

FIG. 9 is a top view of an integrated circuit 900, in accordance with some embodiments. Elements of integrated circuit 900 which are similar to elements of integrated circuit 200 in FIG. 2 are identified with a similar reference numeral, incremented by 700.

Integrated circuit 900 includes source regions 902A, 902B, and 902C. Drain region 904A is between source region 902A and 902B. Drain region 904B is between source region 902B and source region 902C. Active area region 912A separates source region 902A from drain region 904A. Active area region 912B separates drain region 904A from source region 902B. Active area region 912C separates source region 902B from drain region 904B. Drain region 904A includes a first thermal substrate contact 906A and a second thermal substrate contact 906B. First thermal substrate contact 906A has a contact width 914W and second thermal substrate contact 906B has a contact width 916W.

Drain region 904A is an N-doped well having a width equal to region width 913W. Thermal substrate contact 906A has a contact width 914W, and thermal substrate contact 906B has a contact width 916W. The sum of contact width 914W and contact width 916W ranges from 20% to 100% of the region width 913W. In some embodiments, contact width 914W, and contact width 916W, are greater than about 10% of region width 913W. A thermal substrate contact having a contact width less than 10% of the region width 913W is difficult to fill without creating voids in the contact. The sum of contact widths in a drain region (e.g., 914W and 916W) is not greater than the region width (see region width 913W) because the thermal substrate contact extending beyond a perimeter of the region intrudes on other cells or elements of the integrated circuit. In some embodiments, contact width 914W is smaller than contact width 916W. In some embodiments, contact width 914W is greater than contact width 916W. In some embodiments, contact width 914W is the same as contact width 916W. Drain region 904B is an N-doped well having a width equal to region width 913W. Thermal substrate contact 908A has contact width 924W, and thermal substrate contact 908B has contact width 926W. Contact widths in different N-doped wells, or different drain regions, are independent of each other. In some embodiments, contact width 914W is larger than contact width 924W. In some embodiments, contact width 914W is smaller than contact width 924W. In some embodiments, contact width 914W is equal to contact width 924W. Similarly, in some embodiments, contact width 916W is larger than contact width 926W. In some embodiments, contact width 916W is smaller than contact width 926W. In some embodiments, contact width 916W is equal to contact width 926W.

A width of an individual thermal substrate contact (e.g., a dimension parallel to the direction of the source region (see source region 902A)), is determined at a design phase of the IC manufacturing process in order to achieve a cooling performance specification based on transistor density in the region of the integrated circuit. In embodiments wherein the surface density, or coverage area, of thermal substrate contacts varies strongly across the integrated circuit, loading effects during etch processes to form thermal substrate contact openings in the layer of semiconductor material, and/or in the oxide material, make CD (critical dimension, e.g., the dimensions of openings, or other features on an IC substrate) control difficult. Loading effects result in variable contact widths across the surface of the substrate. In some embodiments, a pattern of variation in contact widths also results in a correlating pattern of recess locations across the integrated circuit. Larger contact openings have a higher frequency of recesses in the substrate than smaller contact openings because the substrate is exposed to more etchant through large openings.

FIG. 10A is a block diagram of an integrated circuit 1000, in accordance with some embodiments. In integrated circuit

1000, a first source region 1002A and a second source region 1002B are separated within the cell boundary 1008 by a drain 1004. Thermal substrate contacts 1006 are located within the cell boundary outside the active area wherein the first source region 1002A, the second source region 1002B, and the drain 1004 are located.

FIG. 10B is a block diagram of an integrated circuit 1020, in accordance with some embodiments. In integrated circuit 1020, a cell boundary 1028 includes a plurality of source regions 1022A, 1022B, and 1022C, as well as a plurality of drain regions 1024A and 1024B. A plurality of thermal substrate contacts 1026C are located in the cell boundary 1028 to conduct heat from the cell into the substrate below the transistors. According to some embodiments of the present disclosure, the active area within a cell boundary (see cell boundary 1008) includes as few as one source region and one drain region, up to as many as 32 source regions and 32 drain regions, although other numbers of source regions and drain regions are also contemplated within the scope of the present disclosure.

An aspect of the present disclosure relate to a method of making an integrated circuit which includes operations related to forming an oxide layer over a top surface of a substrate; depositing a layer of semiconductor material over the oxide layer; and manufacturing a thermal substrate contact extending through the layer of semiconductor material and the oxide layer to the top surface of the substrate, wherein the thermal substrate contact is against, but does not extend through, the substrate. In some embodiments, manufacturing a thermal substrate contact further includes operations of etching a first opening through the layer of semiconductor material to expose the oxide layer; etching a second opening through the first opening to expose the substrate; and filling the first opening and the second opening with a conductive material. In some embodiments, filling the first opening and the second opening further includes operations of depositing a metallic layer into the first opening and the second opening; and planarizing the metallic layer to expose the layer of semiconductor material. In some embodiments, the method further includes operations of manufacturing a transistor having, in the layer of semiconductor material, an N-well, a P-well, and a channel; and manufacturing an interconnection structure of the integrated circuit over the layer of semiconductor material, wherein, the manufacturing an interconnection structure of the integrated circuit further includes an operation of electrically insulating the thermal substrate contact from the interconnection structure in the integrated circuit. In some embodiments, the method further includes operations of manufacturing a transistor having, in the layer of semiconductor material, an N-well, a P-well, and a channel; and manufacturing an interconnect structure over the thermal substrate contact, wherein the thermal substrate contact is electrically connected to the interconnect structure. In some embodiments, the method further includes connecting the thermal substrate contact, through the interconnect structure, to a fixed voltage source of the integrated circuit. In some embodiments, the method further includes connecting the thermal substrate contact, through the interconnect structure, to a floating voltage source of the integrated circuit. In some embodiments, manufacturing a thermal substrate contact further includes manufacturing an isolation structure in the layer of semiconductor material; etching a first opening through the isolation structure and the layer of semiconductor material; and filling the first opening through the isolation structure and the layer of semiconductor material with a first conductive material. In some embodiments, manufacturing a thermal substrate contact further includes etching a second opening through the oxide layer to expose the substrate; and filling the second opening with a second conductive material.

An aspect of this description relates to a method of making a semiconductor device. The method includes forming a semiconductor layer over an oxide layer. The method further includes forming a gate structure over the semiconductor layer. The method further includes forming a source region in the semiconductor layer on a first side of the gate structure. The method further includes forming a drain region in the semiconductor layer on a second side of the gate structure. The method further includes forming a first thermal contact extending from above the semiconductor layer, through an entirety of the oxide layer and protruding beyond a bottommost surface of the oxide layer, wherein the source region is between the first thermal contact and the gate structure. The method further includes forming a second thermal contact extending from above the semiconductor layer and into the oxide layer, wherein the second thermal contact extends through the drain region. In some embodiments, the method further includes forming a deep trench isolation (DTI) structure in the semiconductor layer, wherein forming the first thermal contact includes forming the first thermal contact extending through the DTI structure. In some embodiments, the method further includes forming a sleeve material in the drain region, wherein forming the sleeve material includes etching the semiconductor layer to define an opening; and depositing the sleeve material in the opening. In some embodiments, forming the second thermal contact includes forming the second thermal contact extending through the sleeve material. In some embodiments, depositing the sleeve material includes depositing a thermally conductive material. In some embodiments, forming the second thermal contact includes forming the second thermal contact having a bottommost surface coplanar with the bottommost surface of the oxide layer. In some embodiments, the method further includes forming the oxide layer over a substrate. In some embodiments, forming the first thermal contact includes forming the first thermal contact extending into the substrate. In some embodiments, forming the first thermal contact includes forming the first thermal contact extending through less than an entirety of the substrate.

An aspect of this description relates to a method of making a semiconductor device. The method includes forming a semiconductor layer over an oxide layer. The method further includes forming an interconnect structure over the semiconductor layer, wherein the interconnect structure includes a plurality of conductive lines, and each of the plurality of conductive lines is a same distance from a top surface of the oxide layer. The method further includes forming a first thermal contact extending from a first conductive line of the plurality of conductive lines into the oxide layer, wherein the first thermal contact has a first height in a direction perpendicular to the top surface of the oxide layer. The method further includes forming a second thermal contact extending from a second conductive line of the plurality of conductive lines into the oxide layer, wherein the second thermal contact has a second height less than the first height. In some embodiments, the method further includes forming a gate structure of the semiconductor layer, wherein the gate structure is between the first thermal contact and the second thermal contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming an oxide layer over a top surface of a substrate;
depositing a layer of semiconductor material over the oxide layer; and
manufacturing a thermal substrate contact extending through the layer of semiconductor material and the oxide layer to the top surface of the substrate, wherein manufacturing the thermal substrate contact comprises:
etching a recess, wherein the etching exposes a top-most surface of the substrate;
filling the recess with a thermally conductive material, wherein the thermally
conductive material lands on the top-most surface of the substrate;
manufacturing a transistor having, in the layer of semiconductor material, an N-well, a P-well, and a channel; and
manufacturing an interconnect structure over the thermal substrate contact, wherein the thermal substrate contact is electrically connected to the interconnect structure, wherein etching the recess comprises:
etching a first opening through the layer of semiconductor material to expose the oxide layer; and
etching a second opening through the first opening to expose the substrate, wherein etching the second opening is a different process from etching the first opening, wherein filling the recess comprises:
depositing the thermally conductive material into the first opening; and
depositing the thermally conductive material into the second opening.

2. The method of claim 1, wherein depositing the thermally conductive material comprises depositing the thermally conductive material in first opening and the second opening in a continuous deposition process.

3. The method of claim 1, further comprising:
manufacturing a second thermal substrate contact extending through the layer of semiconductor material and the oxide layer to contact the substrate.

4. The method of claim 1, further comprising:
manufacturing a transistor having, in the layer of semiconductor material, an N-well, a P-well, and a channel;
manufacturing a second thermal contact extending through the layer of semiconductor material and the oxide layer; and
manufacturing an interconnection structure of an integrated circuit over the layer of semiconductor material, wherein, the manufacturing an interconnection structure of the integrated circuit further includes an operation of electrically insulating the second thermal substrate contact from the interconnection structure.

5. The method of claim 1, further comprising:
manufacturing a second thermal contact extending through the layer of semiconductor material and the oxide layer, wherein the transistor is between the second thermal contact and the thermal contact.

6. The method of claim 1, further comprising connecting the thermal substrate contact, through the interconnect structure, to a fixed voltage source.

7. The method of claim 1, further comprising connecting the thermal substrate contact, through the interconnect structure, to a floating voltage source.

8. The method of claim 1, wherein manufacturing a thermal substrate contact further comprises:
forming an isolation structure in the layer of semiconductor material;
etching a first opening through the isolation structure and the layer of semiconductor material; and
filling the first opening through the isolation structure and the layer of semiconductor material with the thermally conductive material.

9. The method of claim 8, wherein manufacturing a thermal substrate contact further comprises:
etching a second opening through the oxide layer to expose the substrate; and
filling the second opening with the thermally conductive material.

10. A method of making a semiconductor device, the method comprising:
forming a semiconductor layer over an oxide layer;
forming a gate structure over the semiconductor layer;
forming a source region in the semiconductor layer on a first side of the gate structure;
forming a drain region in the semiconductor layer on a second side of the gate structure;
forming a first thermal contact extending from above the semiconductor layer, through an entirety of the oxide layer and protruding beyond a bottommost surface of the oxide layer, wherein the source region is between the first thermal contact and the gate structure; and
forming a second thermal contact extending from above the semiconductor layer and into the oxide layer, wherein the second thermal contact extends through the drain region.

11. The method of claim 10, further comprising forming a deep trench isolation (DTI) structure in the semiconductor layer, wherein forming the first thermal contact comprises forming the first thermal contact extending through the DTI structure.

12. The method of claim 10, further comprising forming a sleeve material in the drain region, wherein forming the sleeve material comprises:
etching the semiconductor layer to define an opening; and
depositing the sleeve material in the opening.

13. The method of claim 12, wherein forming the second thermal contact comprises forming the second thermal contact extending through the sleeve material.

14. The method of claim 12, wherein depositing the sleeve material comprises depositing a thermally conductive material.

15. The method of claim 10, wherein forming the second thermal contact comprises forming the second thermal contact having a bottommost surface coplanar with the bottommost surface of the oxide layer.

16. The method of claim 10, further comprising forming the oxide layer over a substrate.

17. The method of claim 16, wherein forming the first thermal contact comprises forming the first thermal contact extending into the substrate.

18. The method of claim 17, wherein forming the first thermal contact comprises forming the first thermal contact extending through less than an entirety of the substrate.

19. A method of making a semiconductor device, the method comprising:
- forming a semiconductor layer over an oxide layer;
- forming an interconnect structure over the semiconductor layer, wherein the interconnect structure comprises a plurality of conductive lines, and each of the plurality of conductive lines is a same distance from a top surface of the oxide layer;
- forming a first thermal contact extending from a first conductive line of the plurality of conductive lines into the oxide layer, wherein the first thermal contact has a first height in a direction perpendicular to the top surface of the oxide layer; and
- forming a second thermal contact extending from a second conductive line of the plurality of conductive lines into the oxide layer, wherein the second thermal contact has a second height less than the first height.

20. The method of claim 19, further comprising forming a gate structure of the semiconductor layer, wherein the gate structure is between the first thermal contact and the second thermal contact.

* * * * *